(12) United States Patent
Sugahara

(10) Patent No.: US 7,980,680 B2
(45) Date of Patent: Jul. 19, 2011

(54) METHOD FOR MANUFACTURING PIEZOELECTRIC ACTUATOR, METHOD FOR MANUFACTURING LIQUID TRANSPORTING APPARATUS, PIEZOELECTRIC ACTUATOR, AND LIQUID TRANSPORTING APPARATUS

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 513 days.

(21) Appl. No.: 12/056,785

(22) Filed: Mar. 27, 2008

(65) Prior Publication Data

US 2008/0239024 A1    Oct. 2, 2008

(30) Foreign Application Priority Data

Mar. 30, 2007   (JP) ................. 2007-091994

(51) Int. Cl.
  *B41J 2/045*   (2006.01)
  *H01L 41/00*   (2006.01)
(52) U.S. Cl. ............... 347/70; 347/68; 310/324
(58) Field of Classification Search .............. 347/68–72; 310/311, 324, 330, 331
  See application file for complete search history.

(56) References Cited

U.S. PATENT DOCUMENTS

| | | | | |
|---|---|---|---|---|
| 5,594,292 A | * | 1/1997 | Takeuchi et al. | 310/324 |
| 5,637,382 A | * | 6/1997 | Kataoka et al. | 428/209 |
| 6,447,106 B1 | | 9/2002 | Watanabe et al. | |
| 6,557,986 B2 | | 5/2003 | Watanabe et al. | |
| 7,145,231 B2 | * | 12/2006 | Hasebe et al. | 257/712 |
| 7,597,426 B2 | * | 10/2009 | Ito | 347/68 |
| 7,857,433 B2 | * | 12/2010 | Chung et al. | 347/70 |
| 2005/0285911 A1 | * | 12/2005 | Sugahara | 347/71 |
| 2006/0139415 A1 | | 6/2006 | Taira | |

FOREIGN PATENT DOCUMENTS

| | | |
|---|---|---|
| JP | H11-078004 A | 3/1999 |
| JP | 2002-205408 A | 7/2002 |
| JP | 2006-181958 A | 7/2006 |
| WO | 0071345 A1 | 11/2000 |

* cited by examiner

*Primary Examiner* — Geoffrey Mruk
(74) *Attorney, Agent, or Firm* — Baker Botts L.L.P.

(57) ABSTRACT

A method for manufacturing piezoelectric actuator which includes a piezoelectric layer formed of a piezoelectric ceramics material and having a drive area, a first electrode and a second electrode arranged on both surfaces of the piezoelectric material layer respectively each at portion corresponding to the drive area, and a ceramics layer formed of a ceramics material and stacked to face the surface of the piezoelectric material layer on which the first electrode is arranged, the method including: forming a stacked body which includes the piezoelectric material layer, the ceramics layer, and the first electrode, and sintering the stacked body; forming the second electrode on the other surface, of the piezoelectric material layer after the sintering, not facing the ceramics layer; and forming elastic layers having a lower coefficient of elasticity than that of the piezoelectric material layer on both surfaces respectively of the stacked body after the sintering.

6 Claims, 20 Drawing Sheets

METHOD FOR MANUFACTURING PIEZOELECTRIC ACTUATOR, METHOD FOR MANUFACTURING LIQUID TRANSPORTING APPARATUS, PIEZOELECTRIC ACTUATOR, AND LIQUID TRANSPORTING APPARATUS

CROSS REFERENCE TO RELATED APPLICATION

The present application claims priority from Japanese Patent Application No. 2007-091994, filed on Mar. 30, 2007, the disclosure of which is incorporated herein by reference in its entirety.

BACKGROUND OF THE INVENTION

1. Field of the Invention

The present invention relates to a piezoelectric actuator which is used in an apparatus such as a liquid transporting apparatus.

2. Description of the Related Art

A piezoelectric actuator which drives an object by using a deformation (piezoelectric distortion) of a piezoelectric material layer when an electric field acts, has hitherto been known. For example, in Japanese Patent Application Laid-open No. 2006-181958 (FIG. 7), a piezoelectric actuator which is provided to an ink-jet head which jets an ink from nozzles has been described.

The piezoelectric actuator described in Japanese Patent Application Laid-open No. 2006-181958 is an actuator which is arranged on one surface of a channel unit in which, ink channels including nozzles and pressure chambers are formed, and which makes the ink be jetted from the nozzles by applying a pressure to the ink in a pressure chamber. More concretely, the piezoelectric actuator is made of a piezoelectric ceramics material such as lead zirconate titanate (PZT), and has a plurality of piezoelectric sheets stacked on the one surface of the channel unit to cover the pressure chambers, and two types of electrodes (individual electrodes and common electrode) which are arranged on the piezoelectric sheet positioned at the uppermost layer, on both surfaces of a portion facing the pressure chamber. Moreover, the piezoelectric actuator is structured such that when an electric voltage (electric field) is applied between the two types of electrodes, due to a deformation of an active portion of the piezoelectric material layer, an inactive piezoelectric sheet on a lower side thereof is deformed to form a projection toward the pressure chamber, and the pressure is applied to the ink inside the pressure chamber.

Such piezoelectric actuator is manufactured by the following process. Firstly, after the electrodes are formed on the surface of the plurality of unsintered piezoelectric sheets (green sheets), these piezoelectric sheets are stacked, and a stacked body of the piezoelectric sheets is sintered. Moreover, after applying an adhesive to one surface of the stacked body of the sintered stacked body, the stacked body is pressed against the channel unit (cavity plate) in which the pressure chambers open, and is joined to the channel unit.

However, when the sintered stacked body of the piezoelectric sheets is pressed against the surface of the channel unit in which the pressure chambers which are opened are formed, a stress of the stacked body is concentrated particularly at a portion facing an edge portion of the pressure chamber. Moreover, the piezoelectric sheet made of a ceramics material has a high brittleness after sintering. Furthermore, from a point of view of electric power consumption, the piezoelectric sheet is formed to be thin such that the piezoelectric sheet can be deformed substantially by as low voltage as possible. Therefore, at the locations where the stress is concentrated, a frequency of occurrence of damage such as breaking and cracking of the piezoelectric layer becomes high, which has been a cause of a reduction in the yield.

SUMMARY OF THE INVENTION

An object of the present invention is to provide a method for manufacturing piezoelectric actuator which is capable of suppressing occurrence of damage such as breaking and cracking of the ceramics material layer, by relieving the stress concentration in the stacked body at the time of joining the stacked body of the ceramics material layers upon sintering, to a substrate.

According to a first aspect of the present invention, there is provided a method for manufacturing piezoelectric actuator which includes a piezoelectric material layer formed of a piezoelectric ceramics material and having a predetermined drive area, a first electrode and a second electrode arranged on one surface and the other surface of the piezoelectric material layer respectively each at portion corresponding to the drive area, and a ceramics layer formed of a ceramics material and stacked to face the surface of the piezoelectric material layer on which the first electrode is arranged, the method including: forming a stacked body which includes the piezoelectric material layer, the ceramics layer, and the first electrode arranged between the piezoelectric material layer and the ceramics layer and sintering the stacked body; forming the second electrode on the other surface, of the piezoelectric material layer after the sintering, not facing the ceramics layer; and forming elastic layers having a lower coefficient of elasticity than that of the piezoelectric material layer on both surfaces respectively of the stacked body after the sintering.

Both the piezoelectric material layer and the ceramics layer are formed by a ceramics material which is brittle. Moreover, when the stacked body of the ceramics material layers is joined to a substrate by pressing against the substrate after the stacked body is sintered, a stress is concentrated in a portion of the stacked body (particularly, a portion facing an edge portion of a deformation receiving area, in other words, a boundary between the deformation receiving area and a constrained area), and this portion is susceptible to damage. However, in the present invention, since the resin layer is formed on both surfaces of the stacked body before joining the stacked body to the substrate, the stress concentration occurring in the stacked body at the time of joining the stacked body to the substrate is relieved by the resin layer on both surfaces of the stacked body, and it is possible to suppress the damage to the stacked body. Moreover, it is possible to reduce the stress concentration which occurs at the time of handling the stacked body, such as moving the stacked body and mounting the stacked body on the substrate, and to prevent the damage to a possible extent in such case. In the present invention, the predetermined drive area of the piezoelectric material layer means an area facing the deformation receiving area formed on the substrate when the stacked body is joined to the substrate.

Moreover, since the ceramics layer, unlike the piezoelectric material layer, is not sought to have piezoelectric properties (characteristics), the ceramics layer is not required to be formed of a piezoelectric ceramics material, and may be formed of a ceramics material (such as alumina and zirconia for example) which does not have piezoelectric properties. Moreover, the present invention is assumed to include both cases of joining for joining the stacked body to the substrate, namely a case of joining the piezoelectric material layer to the substrate, and a case of joining the ceramics layer to the substrate. Furthermore, at least one of the piezoelectric material layer and the ceramics layer may be formed of a plurality of ceramics material layers, and the stacked body may have three or more ceramics material layers.

In the method for manufacturing piezoelectric actuator of the present invention, the elastic layers may be resin layers each formed of a resin material.

The method for manufacturing piezoelectric actuator of the present invention, may further include providing a substrate in which a predetermined deformation receiving area is formed; coating an adhesive to at least one of the substrate and the stacked body having the resin layers formed on the both surfaces of the stacked body; and arranging the substrate and the stacked body such that the deformation receiving area corresponds to the drive area, and joining the stacked body to the substrate by pressing the stacked body against the substrate.

In the method for manufacturing piezoelectric actuator of the present invention, each of the resin layers may be formed at a portion corresponding to an area, of the substrate, at which the deformation receiving area is not formed. At the time of joining the stacked body to the substrate by pressing the stacked body against the substrate, a stress is concentrated in a part of the stacked body (particularly a portion facing the edge portion of the deformation receiving area, in other words, the boundary between the deformation receiving area and the constrained area), and this portion is susceptible to damage. However, in the present invention, since the resin layer is joined to the substrate after the resin layer is formed in an area in which the deformation receiving area is not formed, in other words, in the constrained area, the stress concentration occurring in the stacked body at the time of joining the stacked body to the substrate is relieved by the resin layer on both surfaces, and it is possible to suppress the damage to the stacked body.

In the method for manufacturing the piezoelectric actuator of the present invention, a thickness of each of the resin layers may be about 1 to 10 μm.

The method for manufacturing the piezoelectric actuator of the present invention, may further include forming a through hole in one of the resin layers, which is formed on a surface of the piezoelectric material layer not facing the ceramics layer, at a portion corresponding to the drive area, and the second electrode may be formed by depositing an electroconductive material in the through hole. According to this method for manufacturing, since the through hole is formed in the resin layer and then the second electrode is formed in the through hole, it is possible to insulate assuredly the second electrode from the surrounding thereof by the resin layer which is formed of an insulating material.

In the method for manufacturing piezoelectric actuator of the present invention, after the stacked body has been joined to the substrate, the through hole may be formed and then the second electrode may be formed. As in a case of forming the second electrode by a method such as a sputtering method and a vapor deposition method, even when the electrode formation is carried out with the stacked body joined to the substrate, when no substantial external force (force pressing against the substrate) acts on the stacked body, it is possible to form the through hole, and then form the second electrode after the stacked body is joined to the substrate.

In the method for manufacturing piezoelectric actuator of the present invention, before the stacked body is joined to the substrate, the through hole may be formed and then the second electrode may be formed. As in a case of forming the second electrode by a method such as a screen printing, when a comparatively substantial external force (force pressing against the substrate) acts on the stacked body when the electrode is formed with the stacked body joined to the substrate, it is preferable to join the stacked body to the substrate after forming the through hole and the second electrode.

In the method for manufacturing piezoelectric actuator of the present invention, the forming of the second electrode may include arranging a mask material, having a mask hole of a predetermined shape, on the other surface of the piezoelectric material layer not facing the ceramics layer, such that the mask hole overlaps with the through hole formed in the resin layer, and forming the second electrode by depositing the electroconductive material on the other surface of the piezoelectric material layer not facing the ceramics layer and then removing the mask material. In this manner, by depositing the electroconductive material after arranging the mask material having the mask hole of the predetermined shape on the piezoelectric material layer such that the mask hole overlaps with the through hole in the resin layer, the forming of the second electrode in the inner-side area of the through hole becomes easy.

In the method for manufacturing the piezoelectric actuator of the present invention, the mask hole formed in the mask material may have a shape in a plan view such that when the mask hole is overlapped with the through hole formed in the resin layer, and the mask hole may accommodate the through hole entirely. When the mask hole in the mask material is made to be slightly larger than the through hole to accommodate the through hole in the resin layer completely, factors such as a position and a shape of the second electrode which is to be formed on the piezoelectric material layer are determined by the through hole. Consequently, in a case in which, it is possible to form the through hole with a high accuracy of machining by a method such as laser machining, the mask hole is not required to be formed as accurately as the through hole is formed. Moreover, the mask material is not required to be set on the stacked body with high position accuracy. Furthermore, by using the mask material having a mask hole which is slightly larger as compared to the through hole in the resin layer, by making the electroconductive material stick out (protrude) intentionally from the through hole, on the surface of the resin layer, it is possible to form a contact portion for connecting the second electrode to a wire member etc. such that the contact portion is exposed on a surface of the resin layer, simultaneously with forming the second electrode.

According to a second aspect of the present invention, there is provided a method for manufacturing a liquid transporting apparatus including a channel unit having a liquid channel which includes a pressure chamber, the pressure chamber opening in one surface of the channel unit; and a piezoelectric actuator having a piezoelectric material layer which is formed of a piezoelectric ceramics material, a first electrode and a second electrode which are arranged on one surface and the other surface of the piezoelectric material layer respectively each at a portion corresponding to the pressure chamber, and a ceramics layer formed of a ceramics material and stacked to face the surface of the piezoelectric material layer on which the first electrode is arranged, the method including: providing the channel unit; forming a stacked body which includes the piezoelectric material layer, the ceramics layer, and the first electrode arranged between the piezoelectric material layer and the ceramics layer and sintering the stacked body; forming, after the sintering, the second electrode on the other surface of the piezoelectric material layer not facing the ceramics layer; forming elastic layers having a coefficient of elasticity lower than that of the piezoelectric material layer on both surfaces respectively of the stacked body after the sintering; coating an adhesive to at least one of the stacked body having the elastic layers formed on the both surfaces of the stacked body and the one surface of the channel unit; and arranging the stacked body on the one surface of the channel unit to cover the pressure chamber, and then joining the stacked body to the channel unit by pressing the stacked body against the channel unit.

According to the method for manufacturing the liquid transporting apparatus of the present invention, by joining the stacked body to the substrate after forming the resin layer on both surfaces of the stacked body including the piezoelectric material layer and the ceramics layer made of a ceramics material, since the stress concentration which occurs in the stacked body at the time of joining the stacked body to the channel unit is relieved by the resin layer on both sides, it is possible to suppress the damage to the stacked body. Moreover, it is possible to reduce the stress concentration which occurs at the time of handling the stacked body apart from in the joining step, such as moving the stacked body and mounting the stacked body on the surface of the channel unit, and to prevent the damage to a possible extent in such case.

In the method for manufacturing liquid transporting apparatus of the present invention, the elastic layers may be resin layers each formed of a resin material.

In the method for manufacturing liquid transporting apparatus of the present invention, each of the resin layer may be formed at a portion corresponding to an area, of the one surface of the channel unit, at which the pressure chamber does not open. Moreover, the method for manufacturing liquid transporting apparatus may further include forming a through hole in one of the resin layers, which is formed on a surface of the piezoelectric material layer not facing the ceramics layer, at portion corresponding to the pressure chamber, and the second electrode may be formed by depositing an electroconductive material in the through hole. Moreover, the through hole may be formed and the second electrode may be formed after or before joining the stacked body to the channel unit. Moreover, a thickness of each of the resin layer may be about 1 to 10 μm.

According to a third aspect of the present invention, there is provided a piezoelectric actuator including: a piezoelectric material layer which is formed of a piezoelectric ceramics material and which has a predetermined drive area; a first electrode and a second electrode which are arranged on one surface and the other surface respectively of the piezoelectric material layer each at a portion corresponding to the drive area; and a ceramics layer which is formed of a ceramics material and which is stacked to face the surface of the piezoelectric material layer on which the first electrode is arranged, and elastic layers having a coefficient of elasticity lower than that of the piezoelectric material layer are formed on both surfaces respectively of a stacked body which includes the piezoelectric material layer and the ceramics layer.

As in the piezoelectric actuator according to the third aspect of the present invention, when both surfaces of the stacked body including the piezoelectric material layer and the ceramics layer are covered by the resin layer, since the stress concentration occurred in the stacked body at the time of a piezoelectric deformation of the piezoelectric material layer is relieved, a durability of the piezoelectric actuator is improved. Moreover, since the surfaces of the stacked body are covered by the resin layer, the stacked body is hardly damaged even when an external force is acted on the stacked body.

In the piezoelectric actuator of the present invention, the elastic layers may be resin layers each formed of a resin material, and a thickness of each of the resin layers may be about 1 to 10 μm.

In the piezoelectric actuator of the present invention, each of the resin layers may be formed at a portion, of the piezoelectric material layer, corresponding to an area at which the drive area is not defined. Moreover, the second electrode may be arranged on a portion corresponding to an inner peripheral portion of the drive area.

According to a fourth aspect of the present invention, there is provided a liquid transporting apparatus including: a channel unit in which a liquid channel including a pressure chamber is formed, and the pressure chamber opening in one surface of the channel unit; and a piezoelectric actuator including a piezoelectric material layer which is formed of a piezoelectric ceramics material, a first electrode and a second electrode arranged on one surface and the other surface respectively of the piezoelectric material layer each at a portion corresponding to the pressure chamber, and a ceramics layer which is formed of a ceramics material and which is stacked to face the surface of the piezoelectric material layer on which the first electrode is arranged, the piezoelectric actuator having a stacked body including the piezoelectric material layer and the ceramics layer, and elastic layers having a coefficient of elasticity lower than that of the piezoelectric material layer are formed on both surfaces respectively of the stacked body of the piezoelectric actuator.

When both surfaces of the stacked body including the piezoelectric material layer and the ceramics layer are covered by the resin layer, since the stress concentration occurring in the stacked body at the time of deformation of the piezoelectric material layer when a pressure is applied to a liquid inside the pressure chamber is relieved, the durability of the piezoelectric actuator improves. Moreover, since the surfaces of the stacked body are protected by the resin layer, the stacked body is hardly damaged even when an external force acts on the stacked body. Furthermore, a surface toward the pressure chamber of the stacked body being covered by the resin layer, it is possible to prevent assuredly an occurrence of problems such an electrical conduction and an electric discharge between the electrodes due to permeation of a liquid inside the pressure chamber into the ceramics material.

The liquid transporting apparatus of the present invention may further include an adhesive layer which intervenes between the channel unit and the piezoelectric actuator, and the elastic layers may be a resin layers formed of a resin material, and the thickness of each of the resin layers may be about 1 to 10 μm.

In the liquid transporting apparatus of the present invention, each of the resin layers may be formed at a portion, of the piezoelectric layer, corresponding to an area, of the one surface of the channel unit, at which the pressure chamber does not open. Moreover, the first electrode may be arranged on a surface of the piezoelectric material layer, on a side on which the ceramics layer is stacked, and the second electrode may be arranged on a portion corresponding to an inner peripheral portion of the pressure chamber.

BRIEF DESCRIPTION OF THE DRAWINGS

FIG. 6A shows a stacked body sintering step, FIG. 6B shows a resin layer forming step, FIG. 6C shows a joining step, FIG. 6D shows a through hole forming step, and FIG. 6E shows an individual electrode forming step;

FIG. 11A shows a stacked body sintering step, FIG. 11B shows a resin layer forming step, FIG. 11C shows a through hole forming step, FIG. 11D shows an individual electrode forming step, and FIG. 11E shows a joining step;

DETAILED DESCRIPTION OF THE PREFERRED EMBODIMENTS

Next, an embodiment of the present invention will be described below. This embodiment is an example in which, the present invention is applied to an ink-jet head which, as a liquid transporting apparatus, transports an ink to nozzles, and further jets the ink from the nozzles toward a recording paper.

Figure 1:
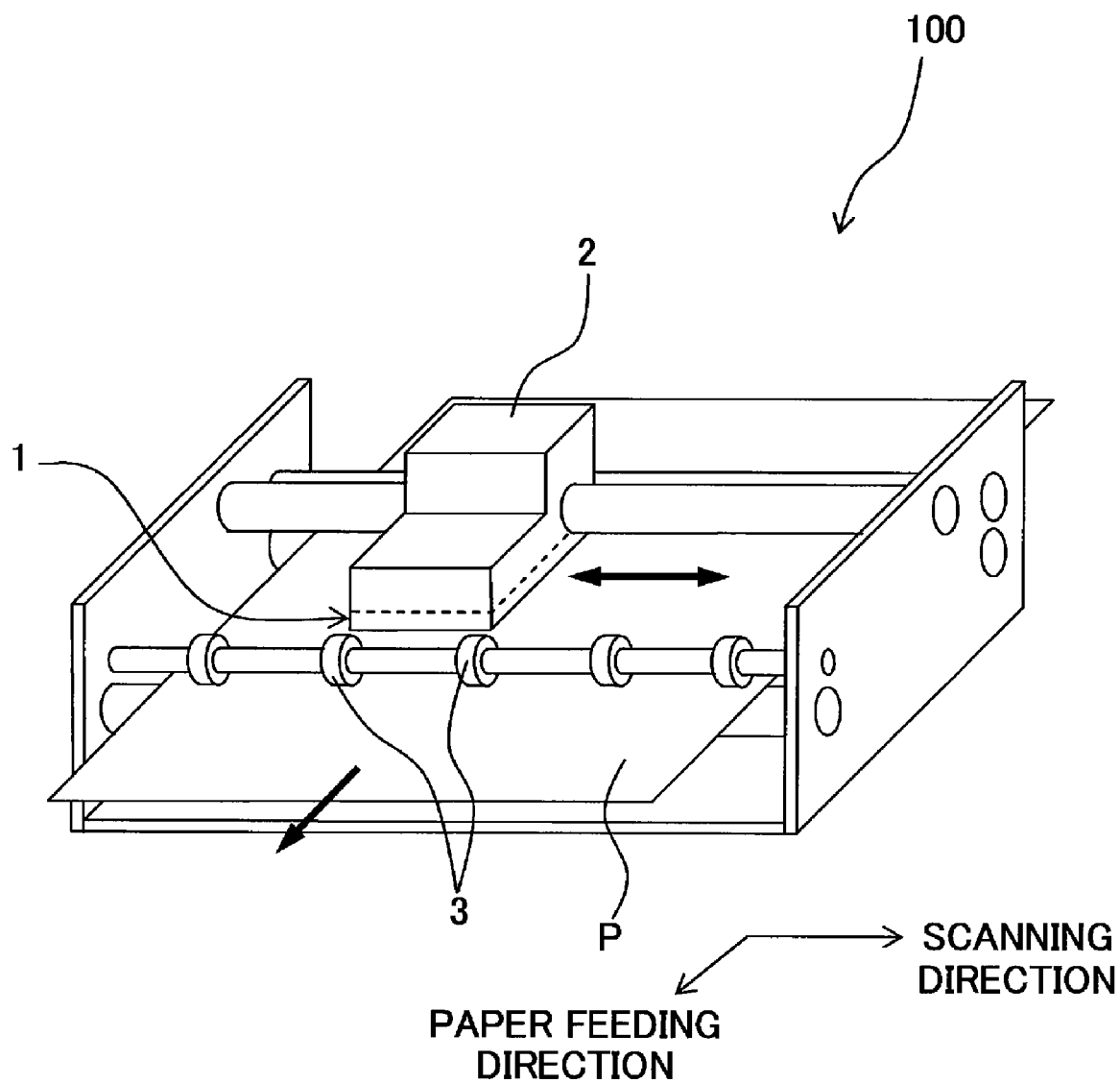
FIG. 1 is a schematic structural view of an ink-jet printer according to an embodiment of the present invention.

Firstly, an ink-jet printer 100 which includes an ink-jet head 1 of this embodiment will be described briefly. As shown in FIG. 1, the ink-jet printer 100 includes a carriage 2 which is movable in a left and right direction in FIG. 1, the ink-jet head 1 of a serial type which is provided on the carriage 2, and which jets the ink onto a recording paper P, and transporting rollers 3 which transports the recording paper P in a frontward direction in FIG. 1.

The ink-jet head 1, while moves integrally with the carriage 2 in the left and right direction, jets the ink supplied from an ink cartridge which is not shown in the diagram, onto the recording paper P from nozzles 20 arranged on a lower surface thereof (refer FIG. 2 to FIG. 5). Moreover, the transporting rollers 3 transport the recording paper P in the frontward direction in FIG. 1. The ink-jet printer 100 is structured to record a desired image and characters etc. on the recording paper P by transporting the recording paper P in the frontward direction by the transporting rollers 3 while jetting the ink onto the recording paper P from the nozzles 20 in the ink-jet head 1.

Next, the ink-jet head 1 will be described in detail. As shown in FIG. 2 to FIG. 5, the ink-jet head 1 includes a channel unit 4 in which ink channels including pressure chambers 14 and nozzles 20 are formed, and a piezoelectric actuator 5 which makes the ink jet from the nozzles 20 of the channel unit 4 by applying a pressure to the ink in the pressure chamber 14.

Figure 4:
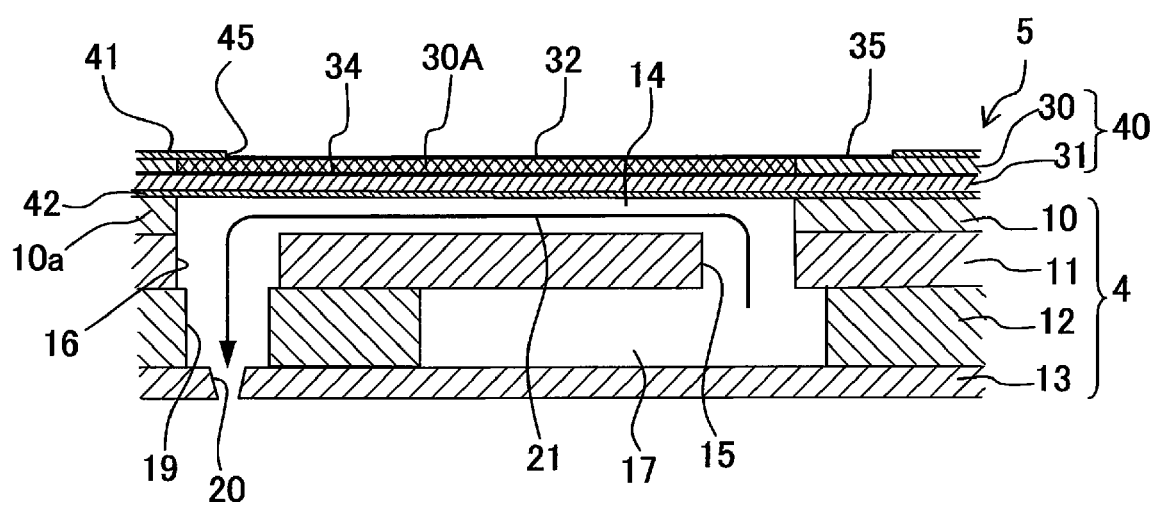
FIG. 4 is a cross-sectional view taken along a line IV-IV in FIG. 3.
Figure 5:
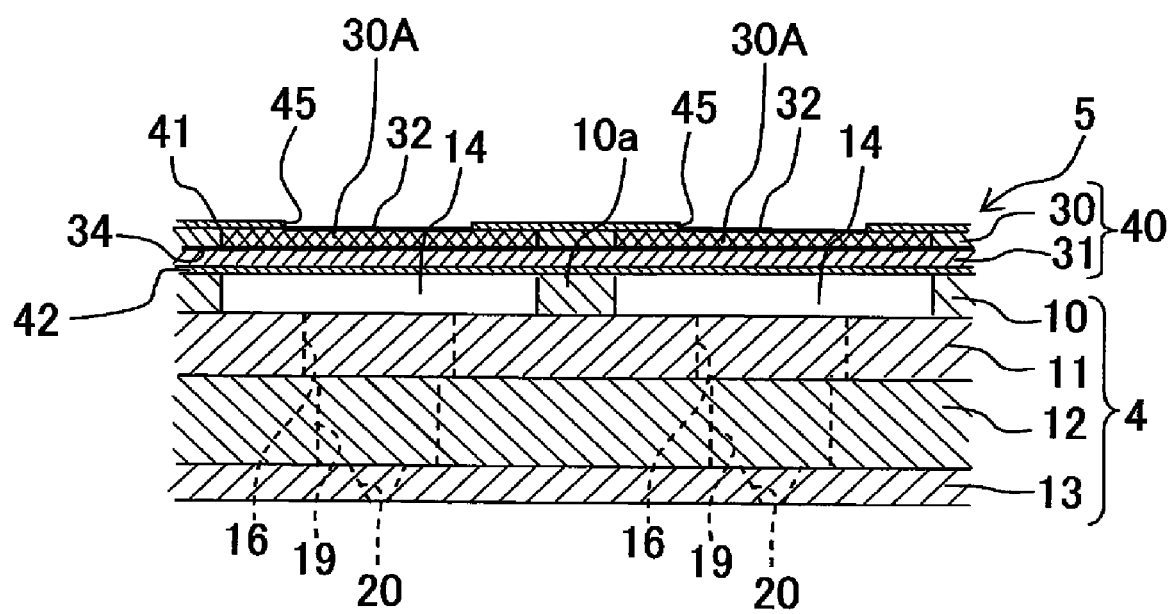
FIG. 5 is a cross-sectional view taken along a line V-V in FIG. 3.

Firstly, the channel unit 4 will be described below. As shown in FIG. 4 and FIG. 5, the channel unit 4 includes a cavity plate 10, a base plate 11, a manifold plate 12, and a nozzle plate 13, and these four plates 10 to 13 are joined in stacked layers. Among these plates, the cavity plate 10, the base plate 11, and the manifold plate 12 are metallic plates made of a metallic material such as stainless steel, and ink channels such as the pressure chambers 14 and a manifold 17 which will be described later can be formed easily in these three plates 10 to 12 by etching. Moreover, the nozzle plate 13 is formed of a high molecular synthetic resin material such as polyimide, and is joined to a lower surface of the manifold plate 12. Alternatively, the nozzle plate 13 may be a metallic plate formed of a metallic material such as stainless steel, similar to the cavity plate 10, the base plate 11, and the manifold plate 12.

As shown in FIG. 2 to FIG. 5, from among the four plates 10 to 13, in the cavity plate 10 (substrate) positioned at the top, the plurality of pressure chambers 14 (deformation receiving area) are formed by through holes penetrating through the cavity plate 10. Moreover, as shown in FIG. 5, adjacent pressure chambers 14 are isolated (separated) by a partition wall 10a. Each pressure chamber 14 is formed to be substantially elliptical shaped with a long axis of the elliptical shape in the scanning direction (left and right direction in FIG. 2) in a plan view. Moreover, the pressure chambers 14 are arranged in two rows in a staggered (zigzag) form in a paper feeding direction (vertical direction in FIG. 2).

Figure 2:
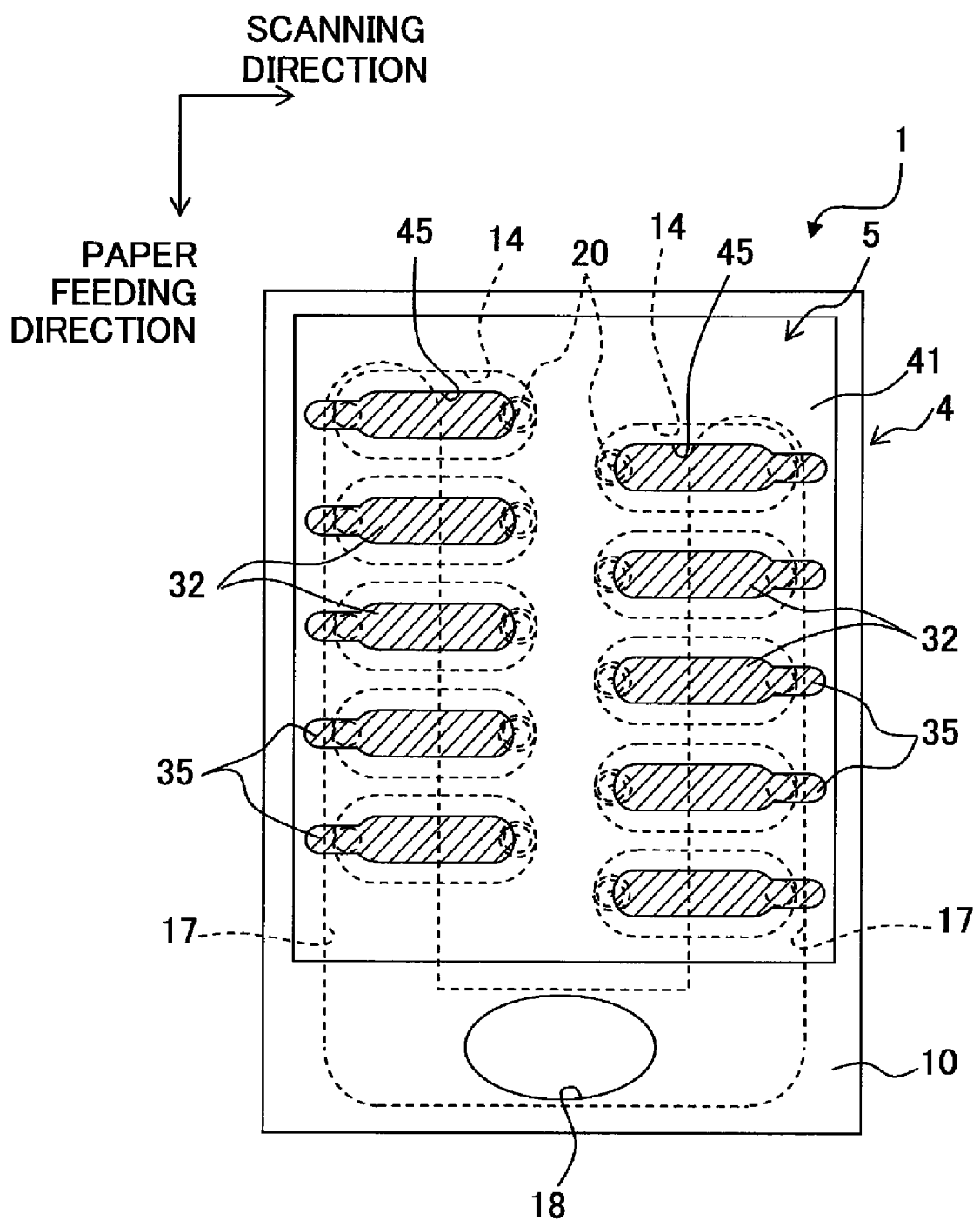
FIG. 2 is a plan view of an ink-jet head.

A lower portion of the pressure chambers 14 formed in the cavity plate 10 is covered by the base plate 11, and each of these pressure chambers 14 opens on an upper surface of the channel unit 4. Furthermore, by joining the piezoelectric actuator 5 which will be described later, to the upper surface of the channel unit 4, the structure becomes such that an upper portion of the pressure chambers 14 is covered by the piezoelectric actuator 5. Moreover, as shown in FIG. 2, an ink supply port 18 which is connected to an ink tank not shown in the diagram is formed in the cavity plate 10.

Figure 3:
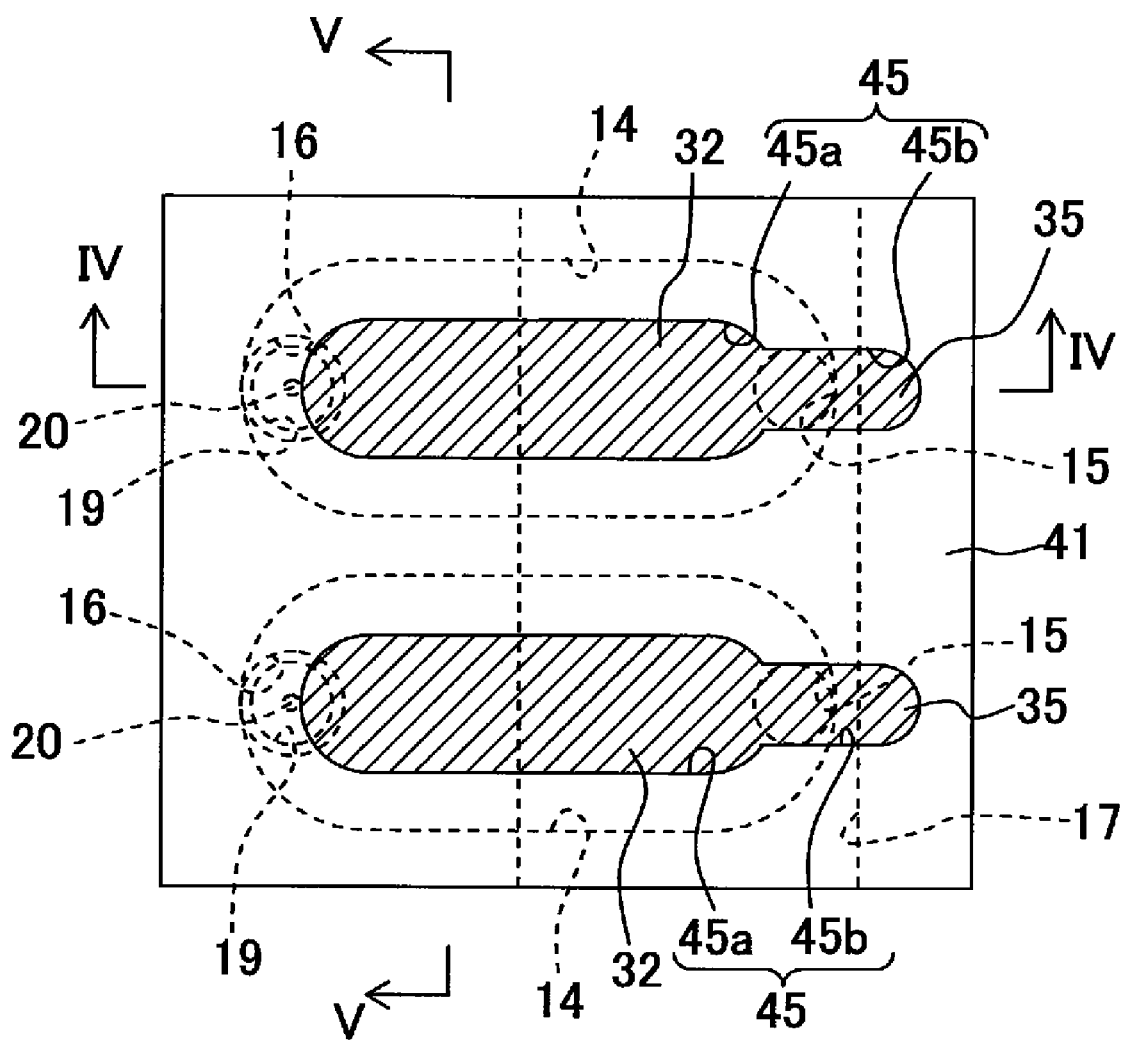
FIG. 3 is a partially enlarged plan view of the ink-jet head shown in FIG. 2.

As shown in FIG. 3 and FIG. 4, communicating holes 15 and 16 are formed in the base plate 11, at positions overlapping with both end portions of the pressure chamber 14 in a plan view. Moreover, two manifolds 17 which extend in the paper feeding direction are formed in the manifold plate 12, to overlap a portion of the pressure chambers 14 arranged in two rows, on a side of the communicating hole 15. These two manifolds 17 communicate with the ink supply port 18 formed in the cavity plate 10, and the ink is supplied to the manifolds 17 from the ink tank which is not shown in the diagram, via the ink supply port 18. Furthermore, a plurality of communicating holes 19 communicating with the communicating holes 16 respectively are formed in the manifold plate 12, at positions overlapping with end portions of the pressure chambers 14 opposite to the manifold 17 in a plan view.

Further, the plurality of nozzles 20 is formed in the nozzle plate 13, at positions overlapping with the communicating holes 19 in a plan view. As shown in FIG. 2, the nozzles 20 are arranged to overlap with end portions of the pressure chambers 14 arranged in two rows along the paper feeding direction, on the opposite side of the manifold 17. In other words, the nozzles 20 are arranged in two rows in zigzag form corresponding to the respective pressure chambers 14.

As shown in FIG. 4, the manifold 17 communicates with the pressure chamber 14 via the communicating hole 15, and further, the pressure chamber 14 communicates with the nozzle 20 via the communicating holes 16 and 19. In this manner, a plurality of individual ink channels 21 from the manifold 17 reaching the nozzles 20 via the pressure chambers 14 are formed in the channel unit 4.

Next, the piezoelectric actuator 5 will be described below. As shown in FIG. 2 to FIG. 5, the piezoelectric actuator 5 includes a piezoelectric material layer 30 and an inactive layer 31 (ceramics layer) which are stacked on the upper surface of the channel unit 4 to cover the pressure chambers 14, a plurality of individual electrodes 32 (second electrodes) which are arranged on an upper surface of the piezoelectric material layer 30, corresponding to a portion 30A (drive area) of the piezoelectric material layer 30, facing the pressure chambers 14, and a common electrode 34 (first electrode) which is arranged on a lower surface of the piezoelectric material layer 30. In other words, the piezoelectric material layer 30 is sandwiched between the individual electrode 32 and the common electrode 34, whereas, the inactive layer 31 is not sandwiched between the individual electrode 32 and the common electrode 34.

By stacking the inactive layer 31 on a lower surface side of the piezoelectric material layer 30 (arrangement surface side of the common electrode 34), a stacked body 40 is formed, and this stacked body 40 is joined to the cavity plate 10 (partition wall 10a) of the channel unit 4, on a lower surface of the inactive layer 31. Moreover, both the piezoelectric material layer 30 and the inactive layer 31 are formed of a ceramics material.

However, the piezoelectric material layer 30 is formed of a piezoelectric ceramics material which is composed of mainly lead zirconium titanate (PZT) which is a solid solution of lead titanate and lead zirconate, and which is a ferroelectric substance, to develop a piezoelectric deformation (piezoelectric distortion) when an electric field is acted on an interior thereof. Moreover, the piezoelectric material layer 30 is polarized in a direction of thickness. On the other hand, the inactive layer 31 is a layer which is deformed following the piezoelectric deformation of the piezoelectric material layer 30, and unlike the piezoelectric material layer 30, is not required to be deformed by its own. Consequently, the inactive layer 31 is not necessarily required to be formed by a piezoelectric ceramics material, and may be formed by a ceramics material which does not have piezoelectric properties, such as alumina and zirconia. However, smaller a difference in a coefficient of thermal expansion of the piezoelectric material layer 30 and the inactive layer 31, a warping (curling) of the piezoelectric actuator which is developed due to the difference in the coefficient of thermal expansion becomes smaller. Therefore, from this point of view, it is preferable that the inactive layer 31 is also formed of a piezoelectric ceramics material having PZT as the main component, same as the piezoelectric material layer 30.

Moreover, on an upper surface of the piezoelectric material layer 30 and a lower surface of the inactive layer 31, elastic layers 41 and 42 each of which has a coefficient of elasticity (Young's modulus) sufficiently lower than a coefficient of elasticity of the piezoelectric material layer 30 (about 90 GPa in general) are formed respectively. Both the elastic layers 41 and 42 may be formed of, for example, a synthetic resin material such as polyimide, or an insulating material. The thickness of each of the elastic layers is preferred to be about 1 to 10 µm. The elastic layers 41 and 42 are described as resin layers 41 and 42 in the following. Moreover, the inactive layer 31 which forms a lower layer of the stacked body 40 is joined to the partition wall 10a of the cavity plate 10 (substrate) via the resin layer 42 which covers a lower surface thereof. Moreover, a plurality of through holes 45 is formed in an area of the resin layer 41 which covers the upper surface of the piezoelectric material layer 30 which forms the upper layer of the stacked body 40, corresponding to the pressure chambers 14 respectively. As shown in FIG. 3, each through hole 45 includes a central portion 45a having a substantially elliptical shape, corresponding to a central portion of the corresponding pressure chamber 14, and an extended portion 45b which is extended from the central portion 45a, along a longitudinal direction thereof. Moreover, the individual electrode 32 and a contact point 35 which will be described later are formed in an inner-side area of each through hole.

The common electrode 34 is arranged between the piezoelectric material layer 30 and the inactive layer 31 (lower surface of the piezoelectric material layer 30). The common electrode 34 is made of an electroconductive material such as gold, copper, silver, palladium, platinum, or titanium. The common electrode 34 is formed to be facing at least all the pressure chambers 14. The common electrode 34 is connected to a driver IC which is not shown in the diagram, and is kept at a ground electric potential which is a reference electric potential, via the driver IC.

Each of the individual electrodes 32 is arranged on the upper surface of the piezoelectric material layer 30 at an area corresponding to one of the drive areas 30A, concretely, in an area corresponding to a substantially central portion of one of the pressure chambers 14. Moreover, the plurality of contact points 35 which are drawn up to the area not facing the pressure chambers 40, is formed on the upper surface of the piezoelectric material layer 30, along a longitudinal direction from one end portion in a longitudinal direction of the individual electrodes 32. Here, each individual electrode 32 is arranged in the inner-side area of the central portion 45a of one through hole 45 formed in the resin layer 41, and the contact point 35 corresponding to this individual electrode 32 is arranged in an inner-side area of the extended portion 45b of the same through hole 45. In this manner, the individual electrode 32 and the contact point 35 are insulated assuredly from the other individual electrode 32 and the contact point 35 positioned around by being surrounded by the resin layer 42 made of an insulating material. Both the individual electrode 32 and the contact point 35 are made of an electroconductive material such as gold, copper silver, palladium, platinum, or titanium, similarly as the common electrode 34.

The contact points 35 of the individual electrodes 32 are connected to a driver IC which is not shown in the diagram, via a flexible printed circuit (FPC). An arrangement is made such that one of two types of electric potential namely, the ground electric potential and a predetermined driving electric potential which is different from the ground electric potential is selectively applied to the individual electrodes 32 from the driver IC.

Next, an action of the piezoelectric actuator 5 at the time of jetting the ink will be described below. When the driving electric potential is selectively applied from the driver IC to the individual electrodes 32, there is a difference in the electric potential of the individual electrode 32 to which the driving electric potential has been applied, and the electric potential of the common electrode 34 on a lower side of the piezoelectric material layer 30 which is kept at the ground electric potential. Due to the electric potential difference, an electric field in a direction of thickness is generated in the piezoelectric material layer 30 sandwiched between the individual electrode 32 and the common electrode 34. When a direction in which the piezoelectric material layer 30 is polarized is same as the direction of the electric field, the piezoelectric material layer 30 is extended in the direction of thickness which is the direction of polarization, and is contracted in a direction of a plane (piezoelectric transverse effect). With the contraction deformation of the piezoelectric material layer 30, a portion of the inactive layer 31 facing the pressure chamber 14 is deformed to form a projection toward the pressure chamber 14 (unimorph deformation). At this time, due to a decrease in a volume of the pressure chamber 14, a pressure is applied to the ink inside the pressure chamber 14, and a droplet of ink is jetted from the nozzle 20 communicating with the pressure chamber 14. Since the individual electrodes 32 are formed corresponding to the drive area 30A of the piezoelectric material layer 30, an area of the piezoelectric material layer 30 which deforms due to application of a drive voltage to the individual electrode 32 almost coincides with the drive area 30A corresponding to the individual electrode 32.

As it has been described above, in the piezoelectric actuator 5 of the embodiment, the resin layers 41 and 42 made of a synthetic resin material are formed on both surfaces of the stacked body 40 which includes two layers of a ceramics material (the piezoelectric material layer 30 and the inactive layer 31) which is a brittle material. Therefore, when the piezoelectric material layer 30 is deformed upon applying the driving electric potential to the individual electrode 32, a stress concentration generated in the two ceramics material layers namely the piezoelectric material layer 30 and the inactive layer 31 is relieved. Therefore, a durability of the piezoelectric actuator 5 is improved. Moreover, since the surface of the stacked body 40 is protected by the resin layers 41 and 42 having a low modulus of elasticity, even when an external force acts on the stacked body 40, the stacked body 40 is hardly damaged.

Furthermore, a surface toward the pressure chamber 14, of the inactive layer 31 being covered by the resin layer 42, the electroconductive ink inside the pressure chamber 14 is permeated into the inactive layer 31 and the piezoelectric material layer 30, and it is possible to prevent assuredly problems such an electrical conduction between the electrodes or an electrical discharge.

Next, a method of manufacturing the ink-jet head 1 of the embodiment will be described below.

Firstly, a manufacturing process of the channel unit 4 will be described briefly. Holes which form ink channels such as the pressure chambers 14 and the manifolds 17 are formed in the cavity plate 10, the base plate 11, and the manifold plate 12, from among the four plates which form the channel unit 4. Here, each of the plates 10 to 12 being a metallic plate, it is possible to form easily the holes which form the ink channels, by etching. Next, the three metallic plates namely the cavity plate 10, the base plate 11, and the manifold plate 12 are stacked and joined. In the joining step, it is possible to join the three plates by a metal diffusion joining by pressurizing (applying pressure to) the stacked plates while heating to a predetermined temperature (1000° C. for example) or more for example. Or the three plates may also be joined by an adhesive.

On the other hand, when the nozzle plate 13 is formed of a synthetic resin material, the plurality of nozzles is formed by laser machining. Moreover, the nozzle plate 13 with the nozzles 20 formed therein is joined to a lower surface of the manifold plate 12 by an adhesive.

When the nozzle plate 13 is a metallic plate same as the cavity plate 10, the base plate 11, and the manifold plate 12, it is possible to join the four plate 10 to 13 including the nozzle plate 13 at a time by the metal diffusion joining after the nozzles 20 are formed in the nozzle plate 13 by a method such as press machining (stamping).

Figure 6:
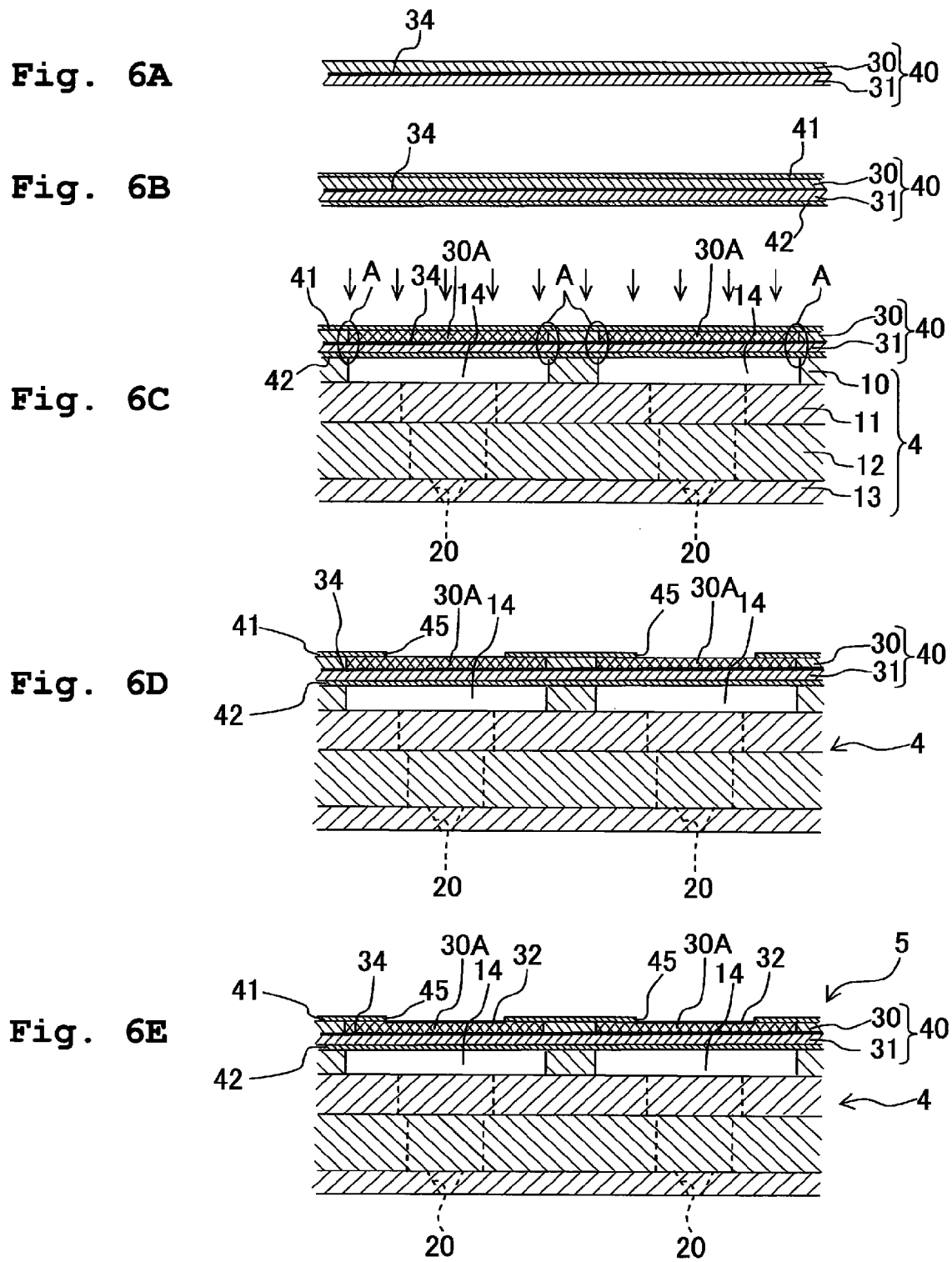
FIG. 6A to FIG. 6E are diagrams showing a manufacturing process of the ink-jet head, where.

Next, the piezoelectric actuator 5 is arranged on the upper surface of the channel unit 4 which has been prepared by the abovementioned steps. A series of steps in the preparation will be described in detail by referring to FIG. 6.

Firstly, as shown in FIG. 6A, the common electrode 34 is formed on one surface of the piezoelectric material layer 31 by a method such as a screen printing and a vapor deposition method, after forming in a sheet form, the inactive layer 31 made of a ceramics material such as alumina and zirconia or PZT, and the piezoelectric material layer 30 made of a piezoelectric ceramics material having PZT as the main component. The inactive layer 31 is stacked on the surface of the piezoelectric material layer 30 on which the common electrode 34 is arranged, and the stacked body 40 is formed. The stacked body 40 may be formed by stacking the piezoelectric material layer 30 on the surface of this inactive layer 31, on which the common electrode 34 is formed, after forming the common electrode 34 on one surface of the inactive layer 31. Thereafter, the stacked body 40 which includes the piezoelectric material layer 30, the inactive layer 31, and the common electrode 34 arranged between the piezoelectric material layer 30 and the inactive layer 31 is heated to a high temperature, and the piezoelectric material layer 30 and the inactive layer 31 are sintered (sintering step).

Next, as shown in FIG. 6B, the resin layers 41 and 42 are formed entirely on both surfaces respectively, of the stacked body 40 (resin layer forming step). It is possible to form the resin layers 41 and 42 by sticking (attaching) a resin film on the surface of the stacked body, or by a method such as by applying a synthetic resin material by a method such as spin coating.

After an adhesive (an epoxy adhesive for example) is coated to at least one of a surface of the resin layer 42 on a lower side and the upper surface of the channel unit 4, the stacked body 40 in a state of both the surfaces thereof being covered by the resin layers 41 and 42 is arranged on the upper surface of the channel unit 4 (cavity plate 10) to cover the pressure chambers 14, as shown in FIG. 6C. Further, the stacked body 40 is joined to the upper surface of the channel unit 4 by pressing the stacked body 40 on the channel unit 4 (joining step). In this case, there is a layer of adhesive (adhesive layer) not shown in the diagram intervening between the lower resin layer 42 and the cavity plate 10.

Here, when the stacked body 40 is joined to the channel unit 4 by pressing, a stress is susceptible to be concentrated in a part of the stacked body 40 (particularly, a location facing an edge portion of the pressure chamber 14: portion A in FIG. 6A to FIG. 6E). Moreover, the stacked body is made of layers (piezoelectric material layer 30 and inactive layer 31) of a ceramics material which is a brittle material. Furthermore, from a point of view of reduction in a power consumption, it is preferable that the piezoelectric material layer 30 and the inactive layer 31 are as thin as possible, so that it is possible to deform the stacked body 40 substantially with as low voltage as possible. Therefore, the stacked body 40 is susceptible to damage such as a crack, at both surfaces of the location of stress concentration (portion A). However, in the embodiment, since both the surfaces of the stacked body 40 are covered by the resin layers 41 and 42 respectively, the stress concentration developed in the stacked body at the time of joining to the channel unit 4 is relieved by the resin layers 41 and 42 on both the surfaces. Therefore, it is possible to suppress the damage of the stacked body 40.

Moreover, it is also possible to reduce the stress concentration which is developed at the time of handling the stacked body 40 in cases other than the joining step, such as moving the stacked body 40 to a predetermined position or mounting the stacked body on the upper surface of the channel unit 4. Therefore, it is possible to prevent as far as possible, the damage of the stacked body 40 at the time of such handling.

Next, as shown in FIG. 6D, the plurality of through holes 45, each having the central portion 45a and the extended portion 45b (refer to FIG. 3) are formed in the area of the resin layer 41 covering the upper surface of the stacked body 40, facing the pressure chambers 14 (through holes forming step). In other words, the resin layer 41 is formed in a portion of the cavity plate 10 (substrate) corresponding to the partition wall 10a (portion in which the deformation receiving area is not formed). Here, as it will be mentioned in an electrode forming step which will be described later, by the through holes 45 formed in this step, positions and a shape of the individual electrodes 32 to be formed in the electrode forming step is almost determined. Consequently, for suppressing as far as possible a variation in the position and shape of the individual electrodes 32, it is preferable that the through holes 45 are formed by a high accuracy of machining. Therefore, as a method for forming the through holes 45, a laser machining for example, is used preferably.

Next, as shown in FIG. 6E, an electroconductive material is made to be deposited on an area of the upper surface of the piezoelectric material layer 30, exposed through the through holes 45 (inner-side area of the through holes 45), and the plurality of individual electrodes 32 and the plurality of contact points 35 are formed (electrode forming step). It is possible to form the individual electrodes 32 and the contact points 35 by various known methods such as a vapor deposition method, the sputtering method, and the screen printing method. However, at the time of forming the electrodes by using the screen printing method, with the stacked body 40 joined to the channel unit 4, since a comparatively substantial external force is exerted on the stacked body, there is a possibility that there is a damage caused by the external force to the stacked body 40 which is made of a brittle material. Therefore, in a case of forming the individual electrodes 32 after the stacked body 40 is joined to the channel unit, as in the embodiment, it is preferable to use a method such as the vapor deposition method and the sputtering method in which no substantial external force acts on the stacked body 40 at the time forming the electrodes.

Moreover, in the electrode forming step, when a mask material having a mask hole of a predetermined shape is used corresponding to the through holes of the resin layer 41, it is possible to form easily a predetermined electroconductive pattern (the individual electrodes 32 and the contact points 35) on the upper surface of the piezoelectric material layer 30.

Figure 7:
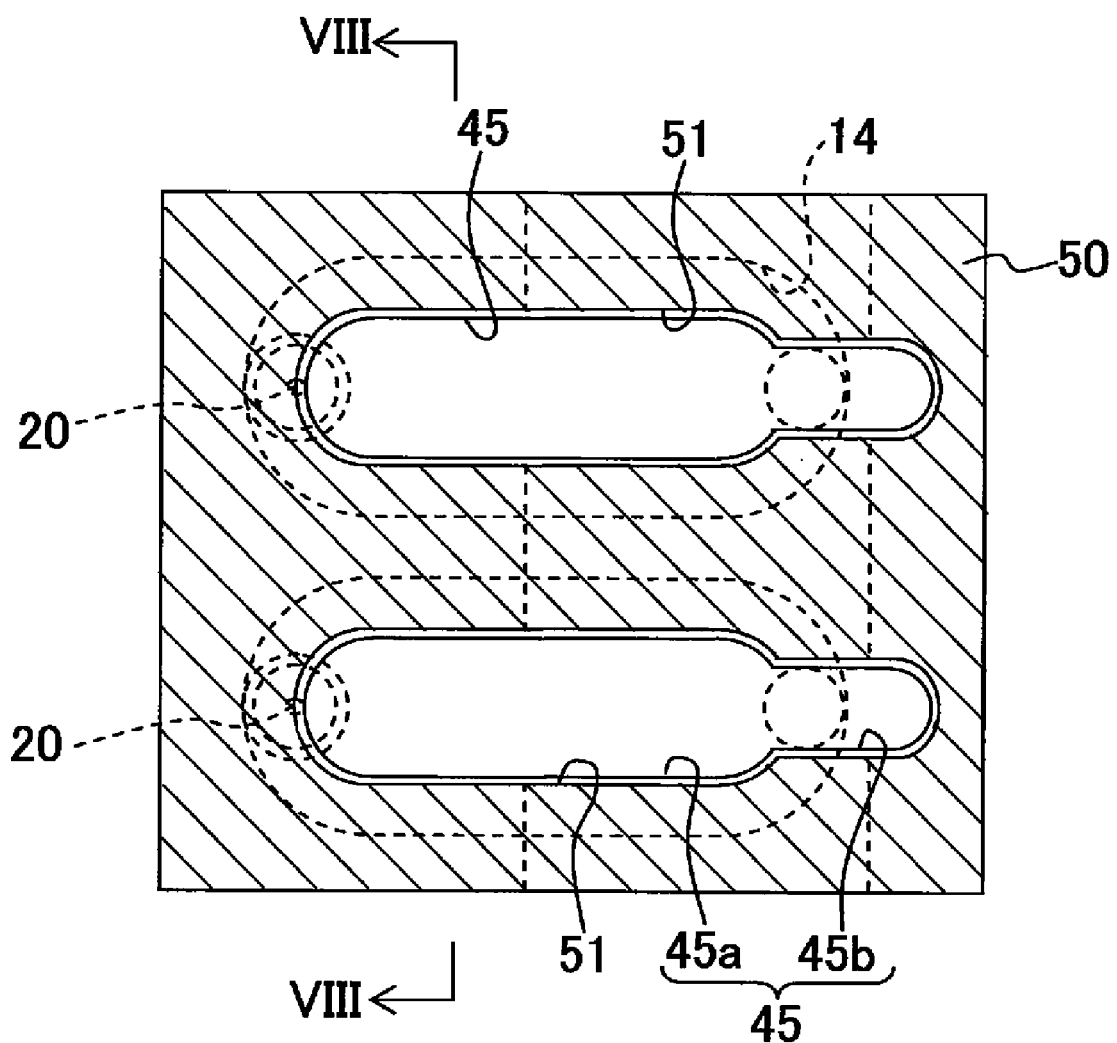
FIG. 7 is a partially enlarged plan view of the stacked body with a masking material arranged, in the individual electrode forming step.
Figure 8:
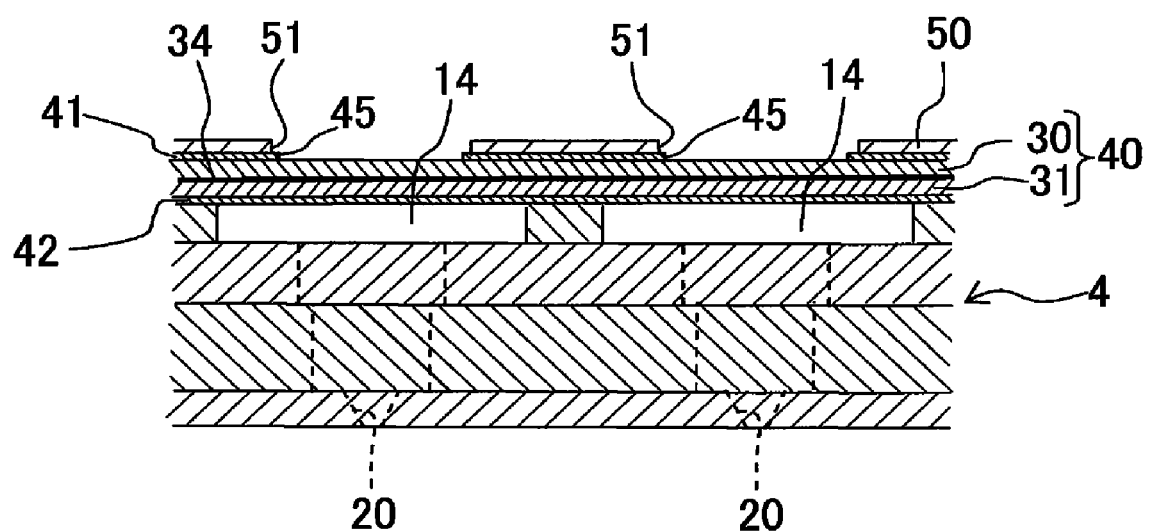
FIG. 8 is a cross-sectional view taken along a line VIII-VIII in FIG. 7.

Concretely, as shown in FIG. 7 and FIG. 8, a mask material 50 which has a plurality of mask holes 51 having shapes corresponding to the through holes 45 of the resin layer is arranged on the upper surface of the piezoelectric material layer 30 such that the mask holes 51 coincide with (overlap) the through holes 45 in the resin layer 41. Next, an electroconductive material is made to be deposited on the entire area of the upper surface of the piezoelectric material layer 30 on which the mask material 50 is arranged, by a method such as the vapor deposition method and the sputtering method. Thereafter, when the mask material 50 is removed, the individual electrode 32 and the contact points 35 are formed only on an inner-side area of the through holes 45, which has been overlapped with the mask holes 51, as shown in FIG. 9 and FIG. 10.

Figure 9:
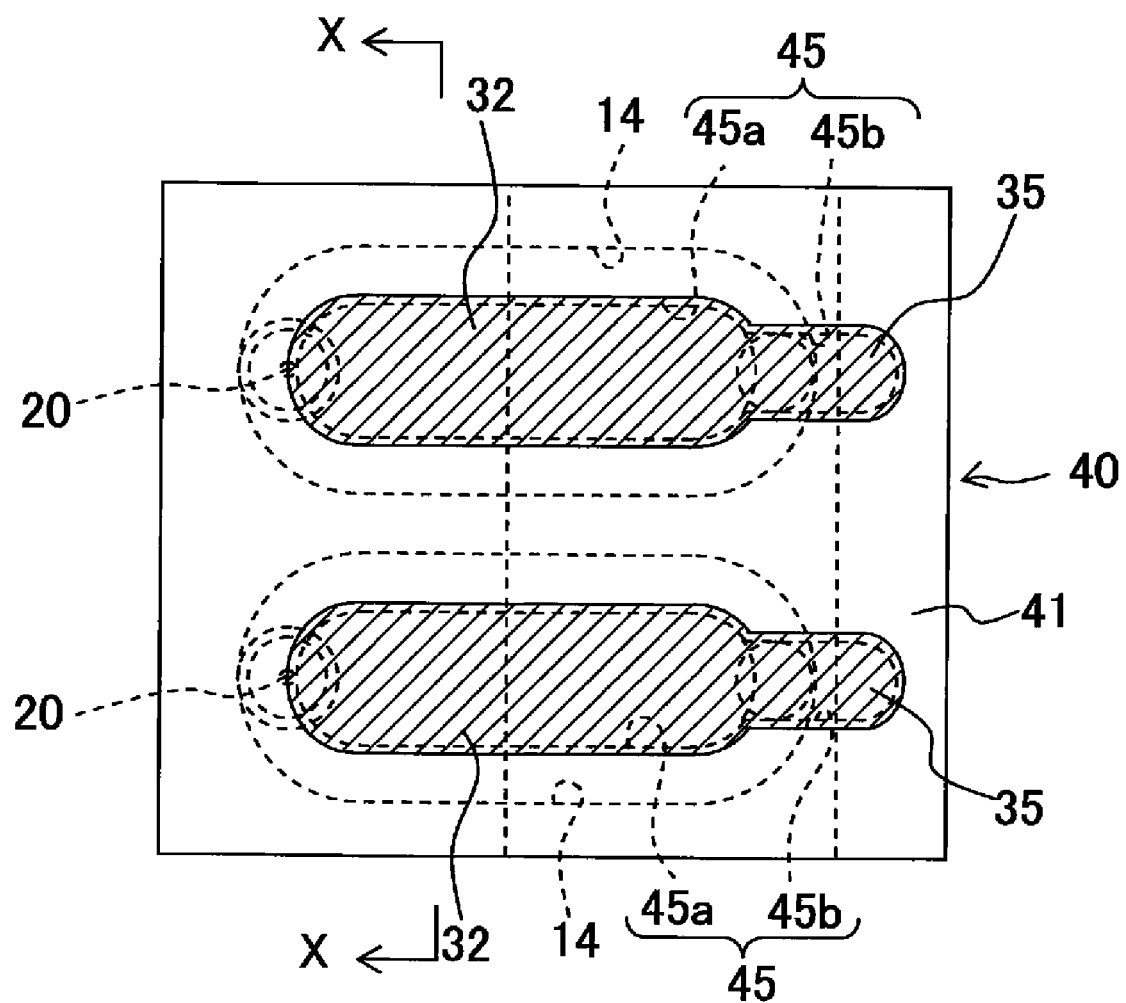
FIG. 9 is a partially enlarged plan view of the stacked body with the masking material removed, in the individual electrode forming step.
Figure 10:
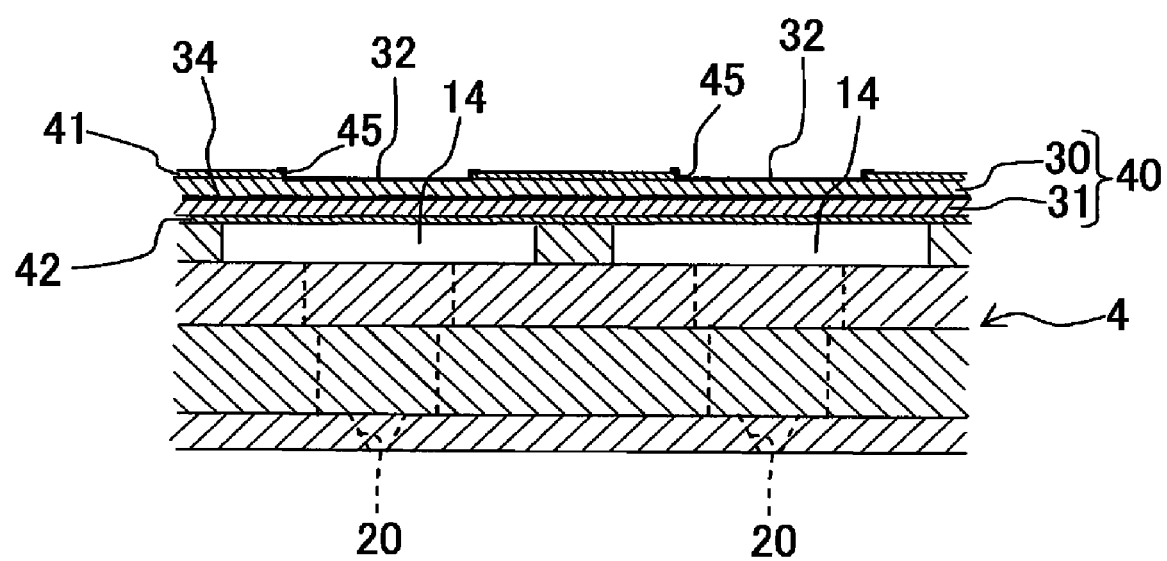
FIG. 10 is a cross-sectional view taken along a line X-X in FIG. 9.

Here, as shown in FIG. 7 and FIG. 8, due to the mask holes 51 being formed with a machining accuracy lower than a machining accuracy of the through holes 45 in the resin layer 41, when a planar shape of the mask holes 51 is slightly larger than the planar shape of the through holes 45 in the resin layer 41, and is a shape which includes the through holes 45 in a plan view, when superimposed on the through holes 45, the electroconductive material is not deposited only on the inner-side area of the through holes 45, but also on an area in which the mask holes 51 are stuck out to an outer side of the through holes 45, as shown in FIG. 9 and FIG. 10. However, since the electroconductive material on the outer-side area of the through holes 45 is deposited on the surface of the resin layer 41, an electric field is not made to act directly on the piezoelectric material layer 30 when the driving electric potential is applied. In other words, a position, a shape, and a size of a substantial portion of the individual electrode 32 (a portion which is arranged directly on the upper surface of the piezoelectric material layer 30, and which generates an electric field in a direction of thickness, in the piezoelectric material layer 30) are determined by the through holes 45 formed in the resin layer 41. Consequently, when the through holes 45 are formed with a high machining accuracy by the laser machining etc., the mask holes 51 are not required only to be formed to have a shape slightly larger to include the through holes 45, but also to be formed with the accuracy with which the through holes 45 are formed. Moreover, the mask holes 50 are also not required to be formed on the upper surface of the piezoelectric material layer 30 with high position accuracy.

Moreover, although it is not shown in FIG. 6A to FIG. 6E, when the electrode forming step in FIG. 6E is terminated and the manufacturing of the piezoelectric actuator 5 is completed, the FPC which is not shown in the diagram is arranged on an upper side of the piezoelectric actuator 5 and the contact points 35 and the FPC are connected, and the individual electrodes 32 and the driver IC are electrically connected via the FPC. At this time, the FPC and the contact points 35 are connected while pressing a plurality of connecting terminals (bumps) which are provided to the FPC, against the contact points arranged on the upper surface of the piezoelectric material layer 30. However, as it has been described above, since both the surfaces of the stacked body 40 are covered by the resin layers 41 and 42 respectively, the stress concentration which is developed in the stacked body due to the external force acting at the time of connecting the FPC is also relieved by the resin layers 41 and 42.

Next, modified embodiments in which, various modifications are made in the embodiment described above will be described. However, same reference numerals are assigned to components having a similar structure as in the embodiment, and the description of such components is omitted.

First Modified Embodiment

In the method of manufacturing the ink-jet head of the embodiment, the individual electrodes 32 are formed on the upper surface of the piezoelectric layer 30 after the through holes 45 are formed in the resin layer 41 on the upper side after joining the stacked body 40 having the both side covered by the resin layers 41 and 42 respectively, to the channel unit 4 (refer to FIG. 6A to FIG. 6E). However, the stacked body 40 may be formed on the channel unit 4 after carrying out the through hole forming step of forming the through holes 45 in the resin layer 41, and the electrode forming step of forming the individual electrodes 32 inside the through holes 45.

Figure 11A:
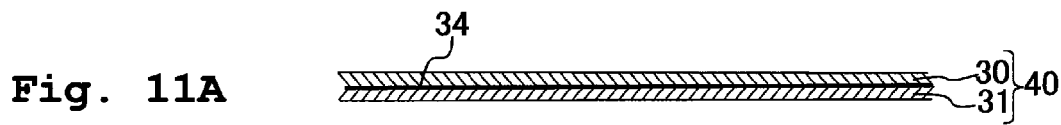
FIG. 11A to FIG. 11E are diagrams showing a manufacturing process of an ink-jet head of a first modified embodiment, where.
Figure 11B:
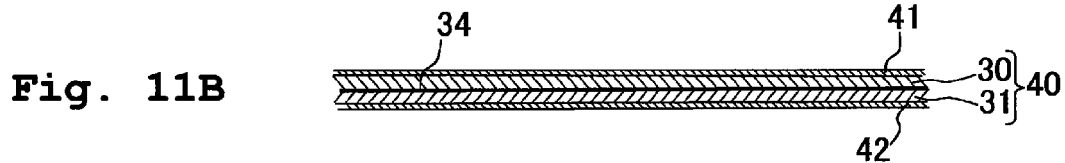
Figure 11C:
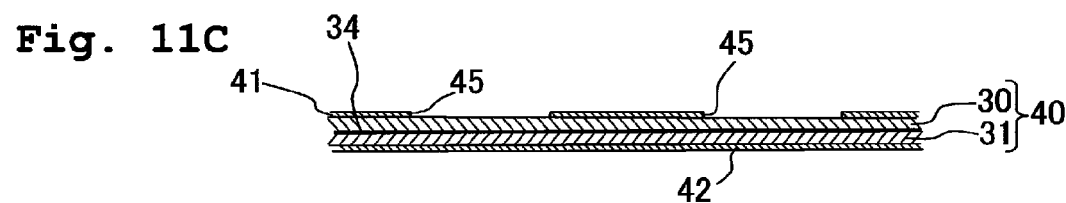
Figure 11D:
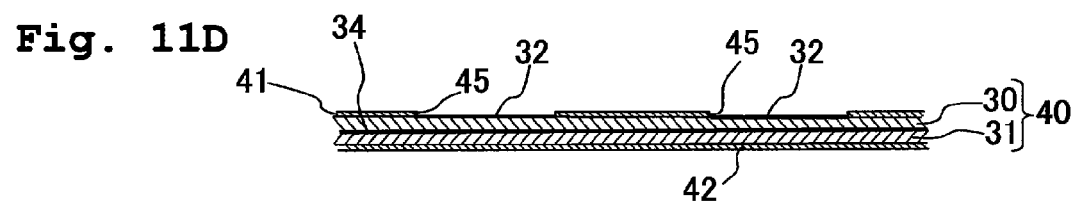
Figure 11E:
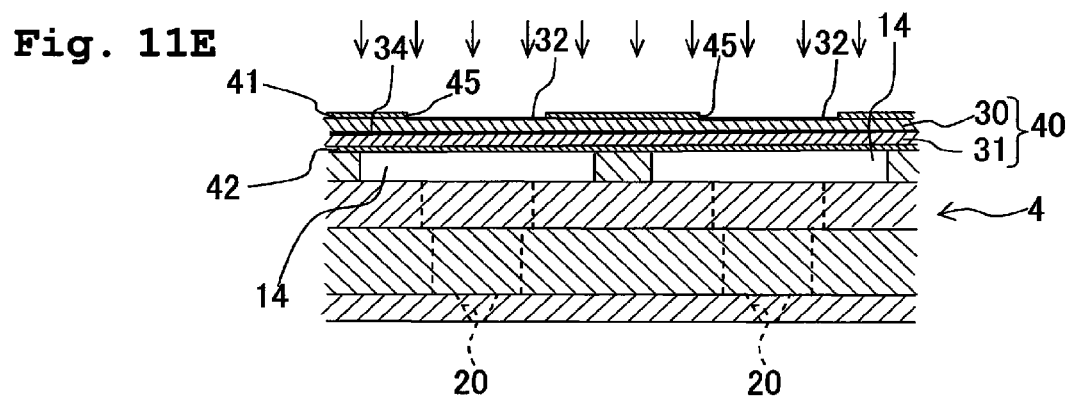

Concretely, the through holes 45 are formed by the laser machining (through hole forming step) in an area of the resin layer 41 on the upper side, which faces the pressure chambers 14 when the stacked body 40 is joined to the channel unit 4 as shown in FIG. 11C, after a sintering step in FIG. 11A, and a resin layer forming step in FIG. 11B are carried out. Furthermore, the individual electrodes 32 and the contact points 35 are formed (electrode forming step) in an area on the upper surface of the piezoelectric material layer 30, on the inner side of the through holes 45 as shown in FIG. 11D. Thereafter, the stacked body 40 having the individual electrodes 32 formed thereon is joined to the upper surface of the channel unit 4 as shown in FIG. 11E.

When a comparatively substantial external force (force pressing the channel unit 4) acts on the stacked body 40 when the individual electrodes 32 are formed in a state of the stacked body 40 joined to the channel unit 4, in a case such as of forming the individual electrodes 32 by using the screen printing method, it is preferable to join the stacked body 40 to the channel unit 4 after carrying out the through hole forming step and the electrode forming step as in the first modified embodiment.

Second Modified Embodiment

Figure 12:
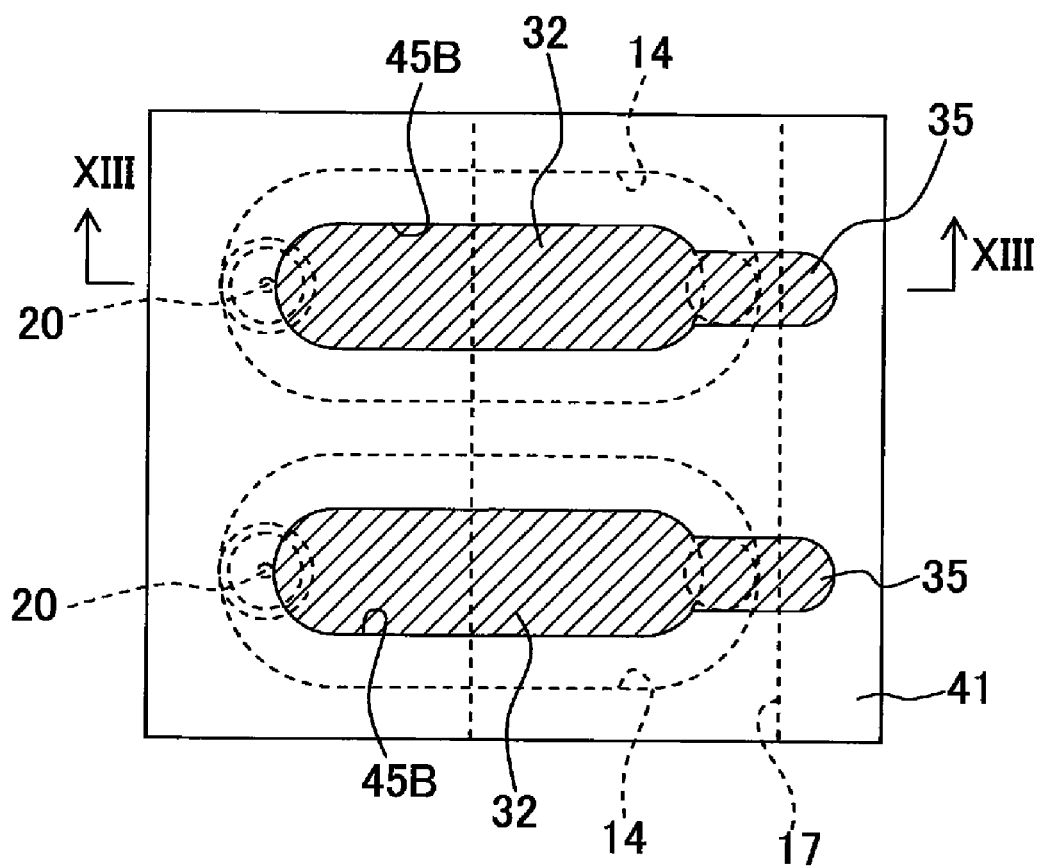
FIG. 12 is a partially enlarged plan view of an ink-jet head of a second modified embodiment.
Figure 13:
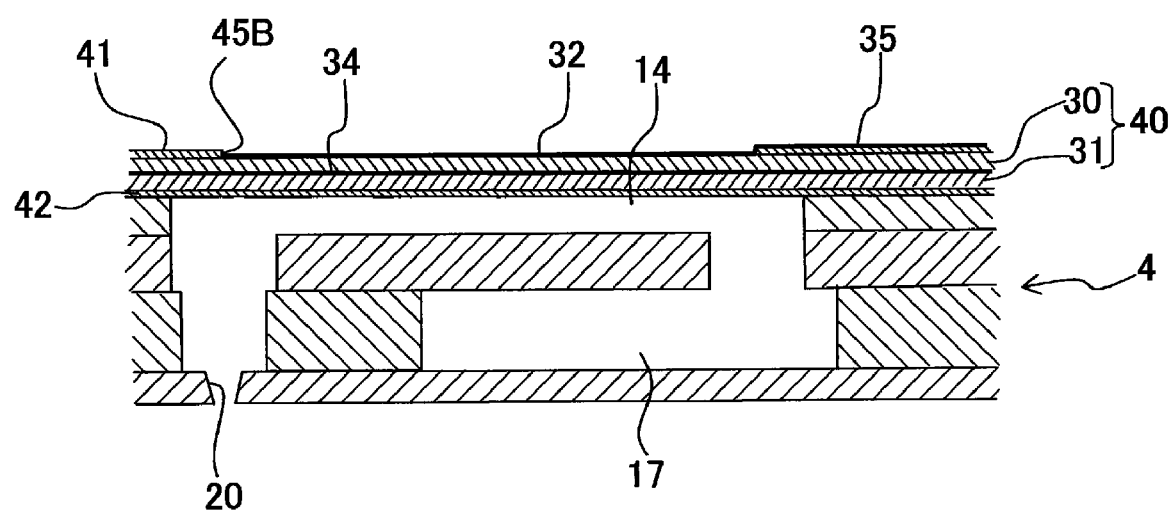
FIG. 13 is a cross-sectional view taken along a line XIII-XIII in FIG. 12.

As shown in FIG. 12 and FIG. 13, the contact points 35 for connecting the individual electrodes 32 and the FPC are not particularly required to be arranged directly on the upper surface of the piezoelectric material layer 30 same as the individual electrodes 32, and the contact points 35 may be arranged on the surface of the resin layer 41 which covers the upper surface of the piezoelectric material layer 30.

In a structure of the second modified embodiment, the resin layer 41 is interposed between the contact points 35 and the upper surface of the piezoelectric material layer 30. Therefore, it is possible to suppress an unnecessary electrostatic capacitance from being generated between the common electrode 34 and the contact point 35 drawn from an individual electrode 32 when the driving electric potential is applied to that certain individual electrode 32. Moreover, since the contact points 35 which are to be connected to the FPC are at a position which is one stage higher than the individual electrodes 32, connecting the connecting terminals (bumps) of the FPC to the contact points 35 becomes easy. Furthermore, it is possible to absorb a variation in a height of the connecting terminals (bumps) when the FPC is pressed against the contact points 35, by a deformation of the resin layer 41 positioned under the contact points 35, and it becomes possible to connect stably the contact points 35 and the connecting points of the FPC.

Figure 14:
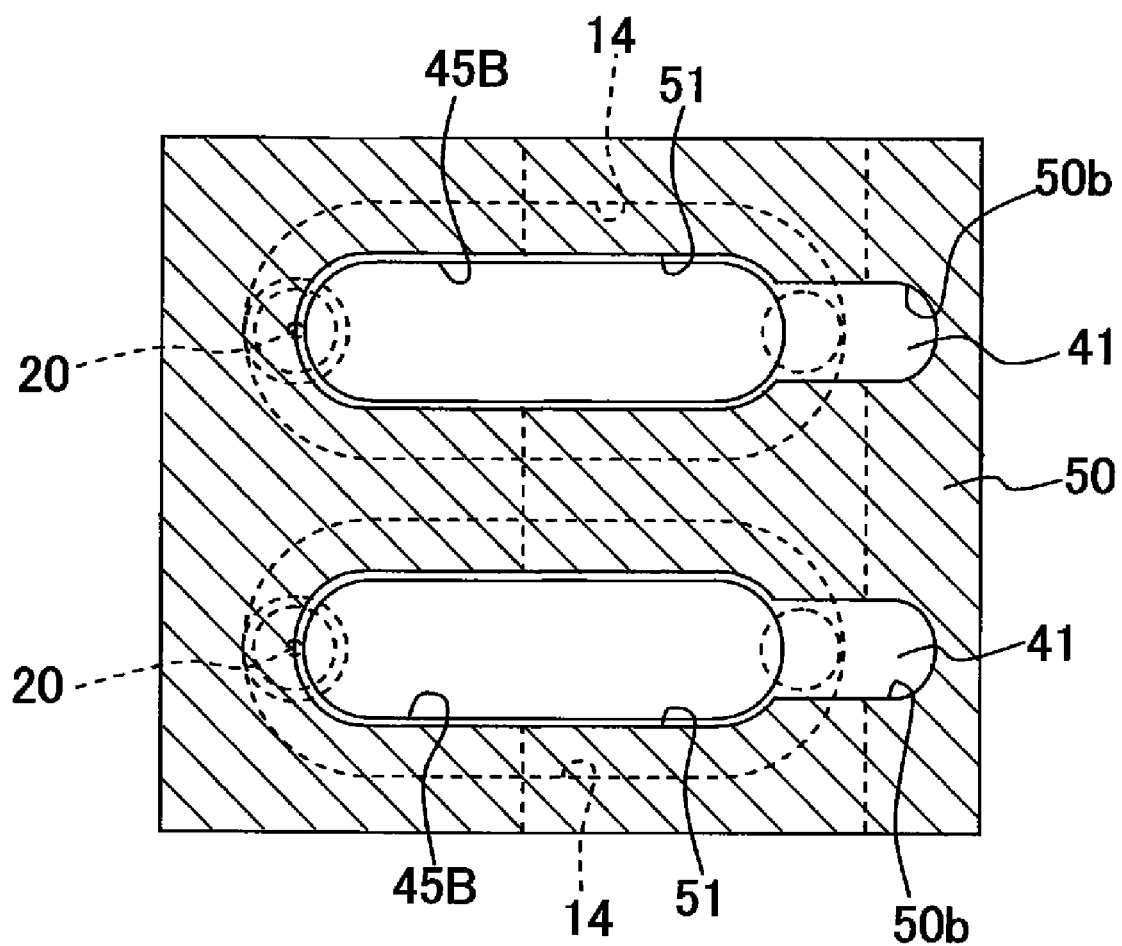
FIG. 14 is a partially enlarged plan view of a stacked body with a masking material arranged, in the individual electrode forming step of the second modified embodiment.

An example of a method of manufacturing in which the structure of the second embodiment has been realized will be cited below. As shown in FIG. 14, firstly, in the through hole forming step, a through hole 45B is formed only in an area of the resin layer 41, facing a central portion of the pressure chamber 14. In other words, unlike in the embodiment (refer to FIG. 7 and FIG. 8), the through hole 45 has a shape not having an extended portion 45b which is extended toward an outer side along the longitudinal direction from the central portion of the pressure chamber 14.

On the other hand, as the mask material 50 to be used in the electrode forming step, a material in which the mask hole 51 slightly larger then the through hole 45B formed in the resin layer 41 (which includes the through hole 45B entirely in a plan view) is prepared. Here, the mask hole 51 has an extended portion 50b which is extended toward an outer side along the longitudinal direction from the central portion of the pressure chamber 14, similarly as in the embodiment (FIG. 7 and FIG. 8). Consequently, when an electroconductive material is made to be deposited after arranging the mask material on the upper surface of the piezoelectric material layer 30, the individual electrode 32 which is adhered directly to the upper surface of the piezoelectric material layer 30 is arranged on an area at an inner side of the through hole 45B, and also the contact point 35 demarcated by the extended portion 50b of the mask hole 51 on the surface of the resin layer 41 is exposed.

Third Modified Embodiment

The individual electrode is not necessarily required to be arranged in an area on the upper surface of the piezoelectric material layer, corresponding the central portion of the pressure chamber 14. For example, as shown in FIG. 15 and FIG. 16, after forming a through hole 45C having almost a ring shape, in an area of the resin layer covering the upper surface of the piezoelectric material layer 30, corresponding a peripheral portion of the pressure chamber 14, an individual electrode 32C having a ring shape may be formed in an inner-side area of the through hole 45C, and a contact point 35 which is drawn from the individual electrode 32C may be formed.

Figure 15:
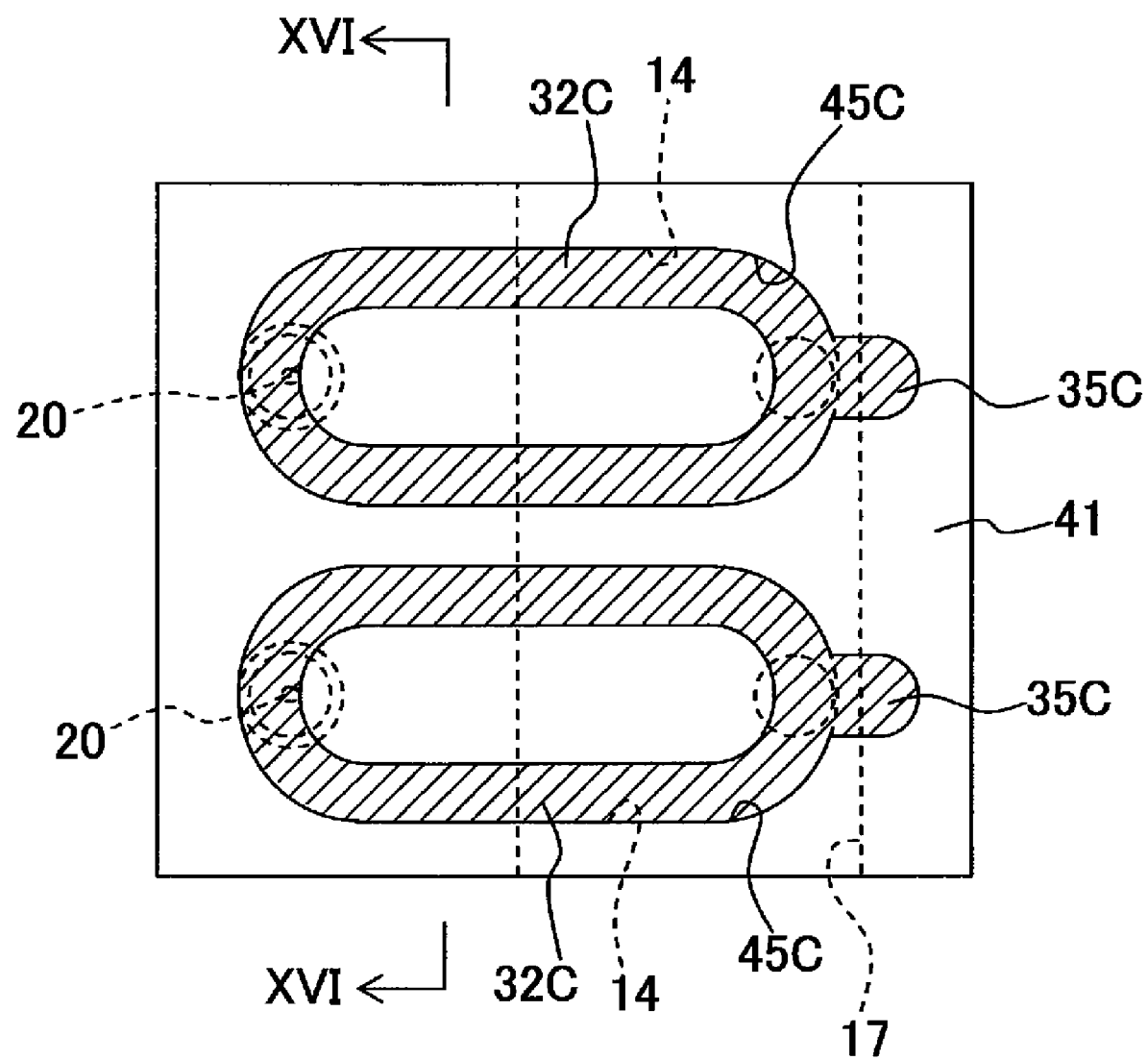
FIG. 15 is a partially enlarged plan view of an ink-jet head of a third modified embodiment.
Figure 16:
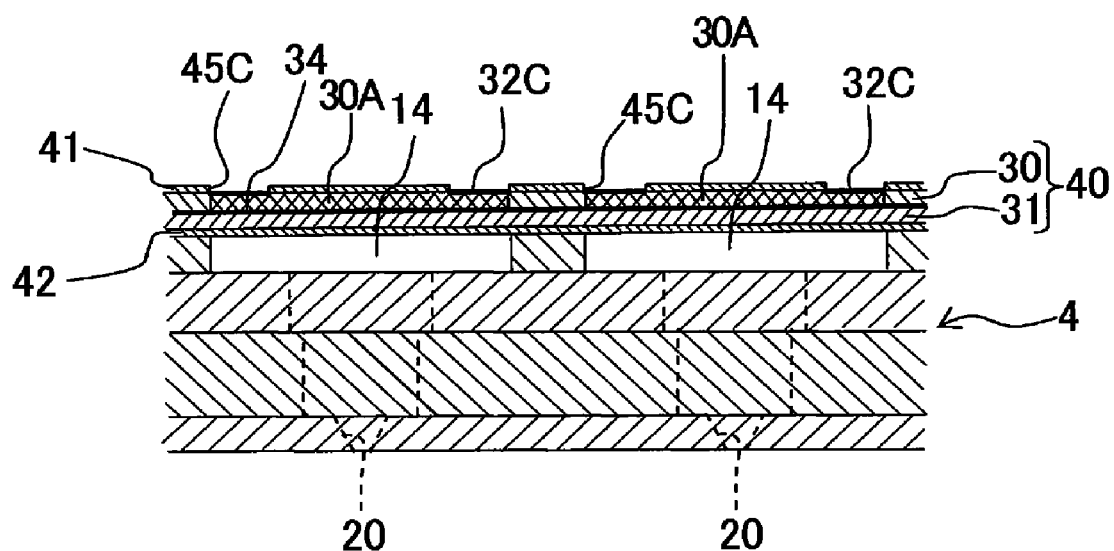
FIG. 16 is a cross-sectional view taken along a line XVI-XVI in FIG. 15.

In a piezoelectric actuator of the third modified embodiment shown in FIG. 15 and FIG. 16, when the driving electric potential is applied to the individual electrode 32C, due to contraction of the piezoelectric material layer 30 in a horizontal direction, in a driving area corresponding the peripheral portion of the pressure chamber 14, in which the individual electrode 32C is arranged, the inactive layer 31 is deformed to form a projection toward the pressure chamber 14. On the other hand, in an area (driven area) facing the central portion of the pressure chamber 14, the piezoelectric material layer 30 and the inactive layer 31 are deformed according to the deformation of the driving area, and are deformed to form projections toward an opposite side of the pressure chamber 14. Consequently, when the driving electric potential is applied to the individual electrode 32C, the volume of the pressure chamber 14 increases, and when the electric potential of the driving electrode returns to the ground electric potential, the volume of the pressure chamber 14 decreases.

Therefore, by carrying out a pulling ejection, it is possible to apply efficiently a pressure to the ink inside the pressure chamber 14 by a low driving voltage. In other words, firstly, the volume of the pressure chamber 14 is increased by applying the driving electric potential to the individual electrode 32, and a negative pressure wave is generated in the ink inside the pressure chamber 14. Further, at a timing at which the pressure wave is changed to a positive pressure wave in connecting portion with the manifold 17, the volume of the pressure chamber 14 is decreased by switching the electric potential of the individual electrode 32C to the ground electric potential, and a positive pressure wave is generated newly in the ink inside the pressure chamber 14. Accordingly, it is possible to apply efficiently a high pressure to the ink by superimposing the positive pressure wave(s) inside the pressure chamber 14.

Fourth Modified Embodiment

Figure 17A:
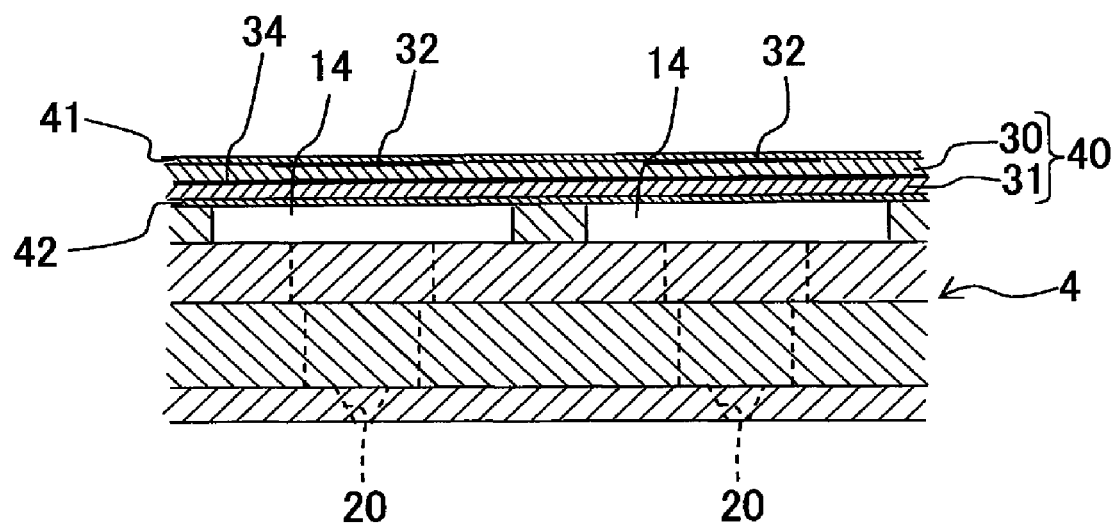
FIG. 17A is a cross-sectional view corresponding to FIG. 5 of an ink-jet head of a fourth modified embodiment.

When it is not necessary to expose the individual electrode such as in a case of drawing around a wire for applying the electric potential from the driver IC, from the individual electrode along the upper surface of the piezoelectric material layer, it is not necessary to form the through hole in the resin layer. In other words, the individual electrode 32 may be covered by the resin layer 41 by forming the resin layer 41 after the individual electrode 32 is formed on the upper surface of the piezoelectric material layer 30 as shown in FIG. 17A.

Figure 17B:
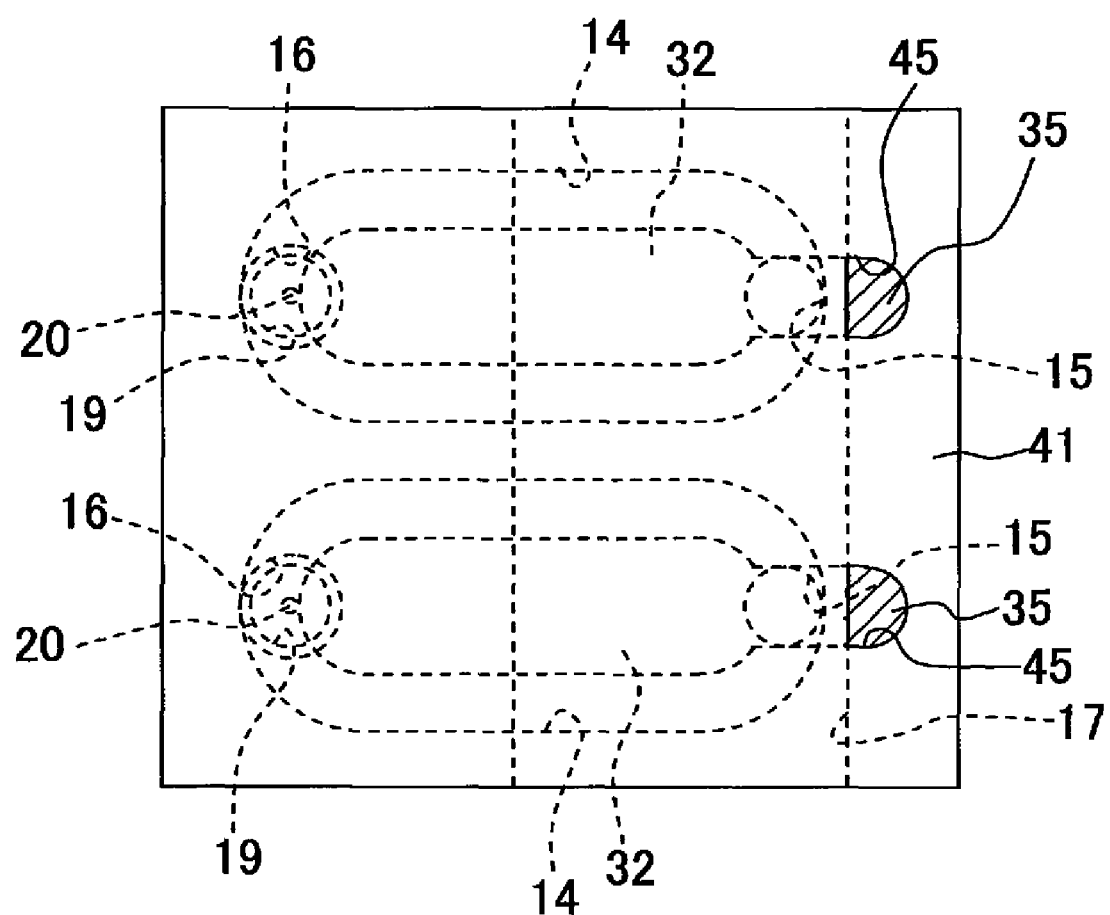
FIG. 17B is a cross-sectional view corresponding to FIG. 3 showing a modified example of the fourth modified embodiment.

As shown in FIG. 17B, the through hole 45 may be formed in a portion corresponding to the contact portion 35 of the resin layer 41. In this case, since only the contact portion 35 is exposed, and the individual electrode 32 is covered by the resin layer 41, at the time of joining an output terminal of the flexible printed circuit and the contact point 35 by a solder for example, it is possible to prevent the solder from flowing to the individual electrode 32. Moreover, at the time of joining to the channel unit 4, since the stress developed in the stacked body 40 is relieved by the resin layers 41 and 42, it is possible to suppress the damage to the stacked body 40.

Fifth Modified Embodiment

Figure 18:
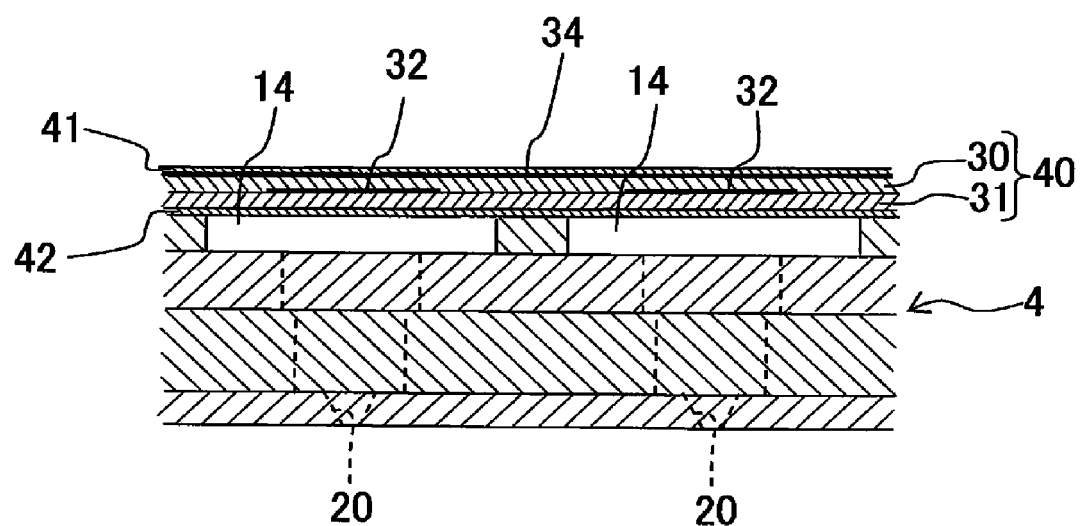
FIG. 18 is a cross-sectional view corresponding to FIG. 5 of an ink-jet head of a fifth modified embodiment.

As shown in FIG. 18, the plurality of individual electrodes 32 may be arranged at positions corresponding to the pressure chambers 14, between the piezoelectric material layer 30 and the inactive layer 31, and the common electrode 34 may also be arranged on the upper surface of the piezoelectric material layer 30, spreading over the pressure chambers 14.

Sixth Modified Embodiment

Figure 19:
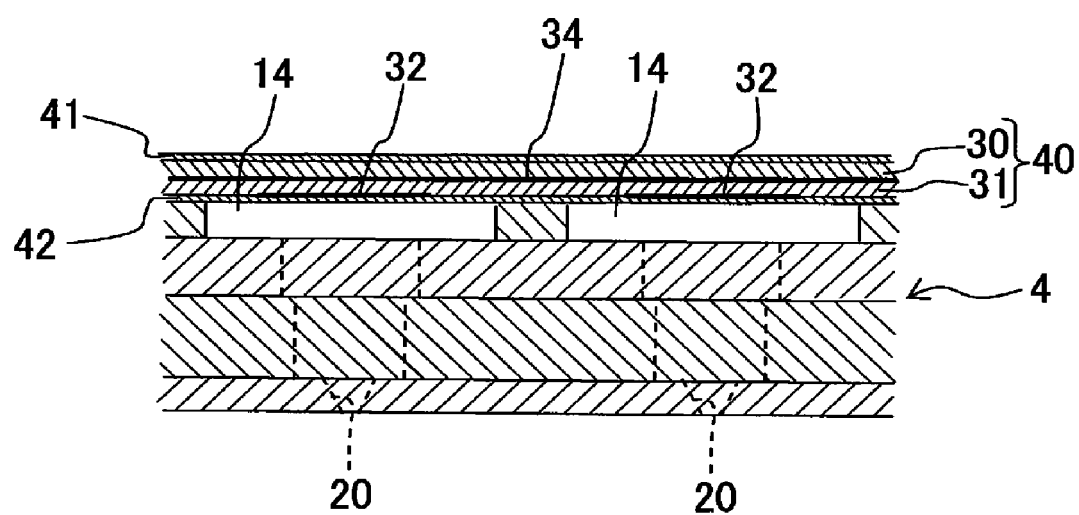
FIG. 19 is a cross-sectional view corresponding to FIG. 5 of an ink-jet head of a sixth modified embodiment.

In the embodiment described above, the inactive layer 31 is joined to the upper surface of the channel unit 4 via the resin layer 41 (refer to FIG. 4 and FIG. 5). However, the stacked body 40 may be formed by stacking the inactive layer 31 on the upper surface of the piezoelectric material layer 30 made of a piezoelectric ceramics material, and the lower surface of the piezoelectric material layer 30 of the stacked body 40 may be joined to the upper surface of the channel unit 4 as shown in FIG. 19.

Seventh Modified Embodiment

In the embodiment and the first modified embodiment to the sixth modified embodiment, the stacked body 40 which is to be joined to the channel unit 40 has been made of two ceramics material layers (one piezoelectric material layer 30 and one inactive layer 31). However, the present invention is applicable even in a case in which the stacked body which is to be joined to the channel unit 4 includes three or more ceramics material layers.

Figure 20:
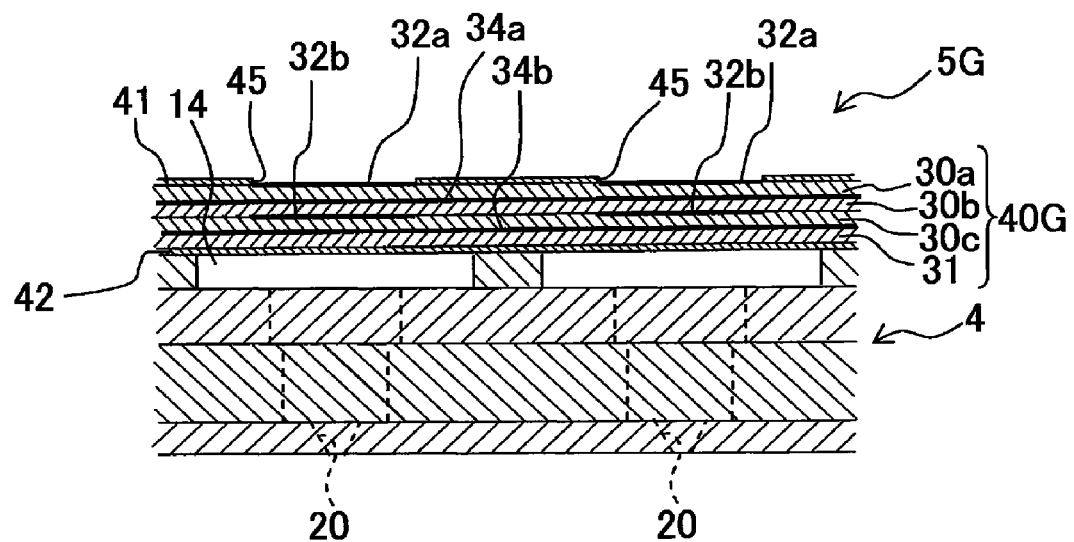
FIG. 20 is a cross-sectional view corresponding to FIG. 5 of an ink-jet head of a seventh modified embodiment.

For example, as shown in FIG. 20, a piezoelectric actuator 5G may have a stacked body 40G which includes three piezoelectric material layers 30 (30a, 30b, and 30c), and one inactive layer 31, and the resin layers 41 and 42 may be formed respectively on two surface of the stacked body 40G which is made of the four ceramics material layers. Furthermore, in the piezoelectric actuator 5G of the seventh modified embodiment, the through hole 45 is formed in the resin layer 41 which covers the uppermost piezoelectric material layer 30a, and an individual electrode 32a corresponding to the pressure chamber 14 is formed in the inner-side area of the through hole 45. Moreover, a common electrode 34a is arranged between the uppermost piezoelectric material layer 30a and the second piezoelectric material layer 30b, and an individual electrode 32b is arranged between the second piezoelectric material 30b and the third piezoelectric material layer 30c. Furthermore, a common electrode 34b is arranged between the third piezoelectric material layer 30c and the inactive layer 31. Moreover, the individual electrode 32a and the individual electrode 32b corresponding to one pressure chamber 14 are in mutual electrical conduction in an area which is not shown in FIG. 20. Further, when the driving electric potential is applied to the individual electrodes 32a and 32b corresponding to a certain pressure chamber 14, a portion of each of the three piezoelectric material layers 30a to 30c sandwiched between the individual electrode 32 and the common electrode 34 is extended in the direction of thickness which is parallel to the direction of the electric field (piezoelectric longitudinal effect), and due to the extension, the inactive layer 31 is deformed to form a projection toward the pressure chamber 14.

In the seventh modified embodiment, the common electrode 34b arranged between the third piezoelectric material layer 30c and the inactive layer 31 corresponds to a first electrode of the present invention application, and the individual electrode 32a formed on the upper surface of the uppermost piezoelectric material layer 30a corresponds to a second electrode of the present invention.

Figure 21:
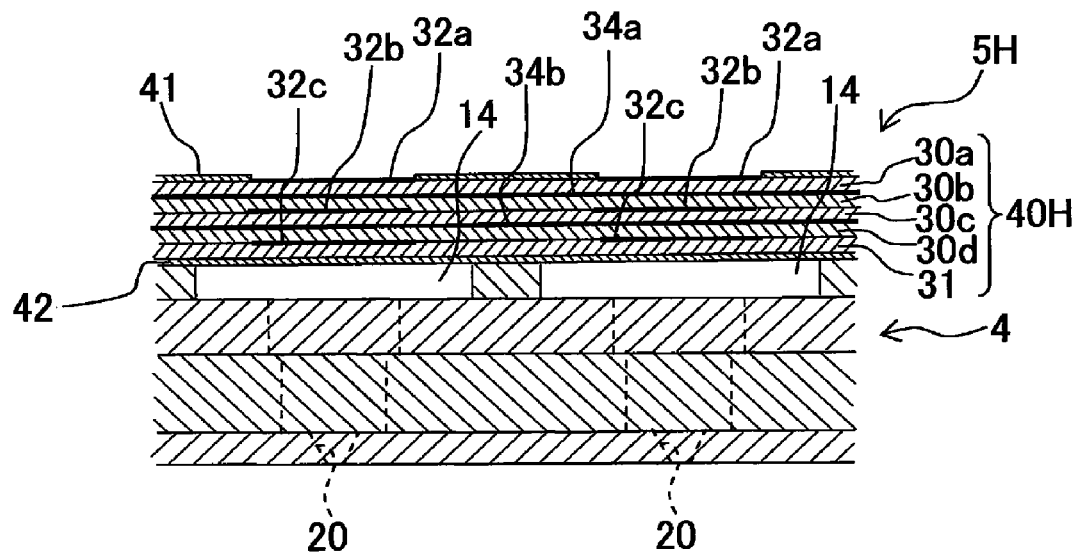
FIG. 21 is a cross-sectional view corresponding to FIG. 5 of an ink-jet head of an eighth modified embodiment.

Moreover, as a piezoelectric actuator 5H of an eighth modified embodiment shown in FIG. 21, when a stacked body 40H has four piezoelectric material layers (30a, 30b, 30c, and 30d), an individual electrode 32c is to be arranged between the lowermost (fourth layer) piezoelectric material layer 30d and the inactive layer 31. Consequently, in the eighth embodiment, the individual electrode 32c arranged between the lowermost piezoelectric material layer 30d and the inactive layer 31 corresponds to the first electrode of the present invention, and the individual electrode 32a formed on the upper surface of the uppermost piezoelectric material layer 30a corresponds to the second electrode of the (patent application for the) present invention.

Figure 22:
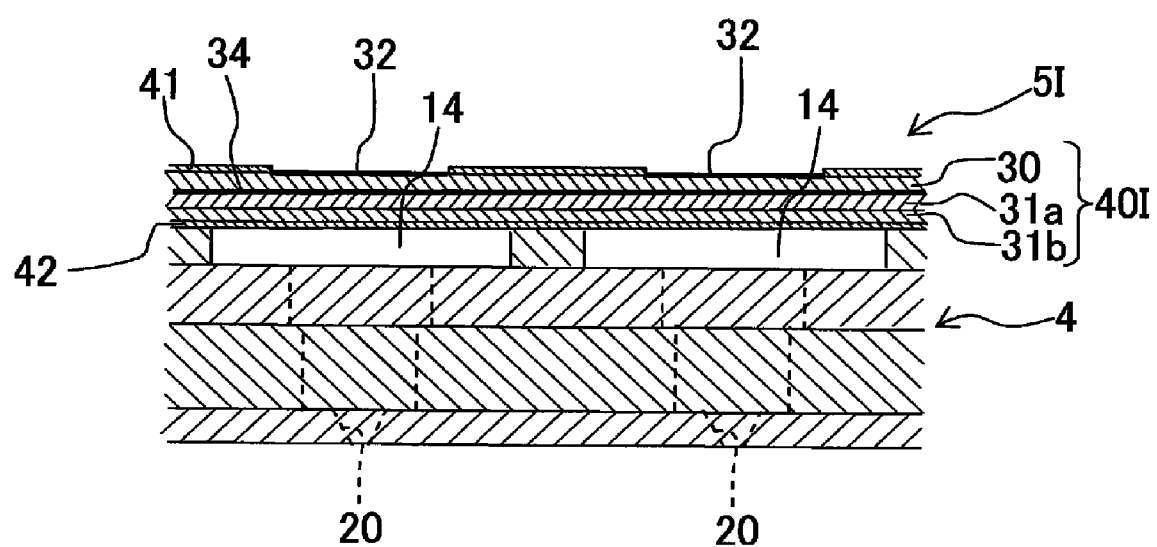
FIG. 22 is a cross-sectional view corresponding to FIG. 5 of an ink-jet head of a ninth modified embodiment.

Furthermore, as a piezoelectric actuator 5I of a ninth modified embodiment shown in FIG. 22, the present invention is applicable even when two or more inactive layers 31 (31a and 31b) are included in a stacked body 40I which is to be joined to the channel unit 4.

In the description made above, an example in which the present invention is applied to a piezoelectric actuator including an ink-jet head which applies a jetting pressure to the ink inside the pressure chamber have been cited as an embodiment of the present invention. However, the application of the present invention is not restricted to the example cited. The present invention is also applicable to a piezoelectric actuator as a liquid transporting actuator, such as a liquid transporting apparatus which transports a liquid such as a drug solution and a biochemical solution inside a micro total analyzing system (μTAS), and a liquid transporting apparatus which transports a liquid such as a solvent and a biochemical solution inside a micro chemical system.

Furthermore, the application of the present invention is not restricted to an actuator which applies a pressure to a liquid such as an ink. In other words, the present invention is also applicable to a piezoelectric actuator which is used for an application other than transporting a liquid such as an actuator which thrust drives various objects by a deformation of a stacked body thereof, while allowing a deformation of the stacked body in a deformation receiving area of a substrate.

What is claimed is:

1. A piezoelectric actuator comprising:
    a piezoelectric material layer which is formed of a piezoelectric ceramics material and which has a predetermined drive area;
    a first electrode and a second electrode which are arranged on one surface and the other surface respectively of the piezoelectric material layer each at a portion corresponding to the drive area; and
    a ceramics layer which is formed of a ceramics material and which is stacked to face the surface of the piezoelectric material layer on which the first electrode is arranged,
    wherein elastic layers having a coefficient of elasticity lower than that of the piezoelectric material layer are formed on both surfaces respectively of a stacked body which includes the piezoelectric material layer and a surface of the ceramics layer opposite the surface facing the piezoelectric material layer, and
    wherein the elastic layers are resin layers each formed of a resin material, and a thickness of each of the resin layers is about 1 to 10 μm.

2. The piezoelectric actuator according to claim 1, wherein each of the resin layers is formed at a portion, of the piezoelectric material layer, corresponding to an area at which the drive area is not defined.

3. The piezoelectric actuator according to claim 2, wherein the second electrode is arranged on a portion corresponding to an inner peripheral portion of the drive area.

4. A liquid transporting apparatus comprising:
    a channel unit in which a liquid channel including a pressure chamber is formed, and the pressure chamber opening in one surface of the channel unit;
    a piezoelectric actuator including a piezoelectric material layer which is formed of a piezoelectric ceramics material, a first electrode and a second electrode arranged on one surface and the other surface respectively of the piezoelectric material layer each at a portion corresponding to the pressure chamber, and a ceramics layer which is formed of a ceramics material and which is stacked to face the surface of the piezoelectric material layer on which the first electrode is arranged, the piezoelectric actuator having a stacked body including the piezoelectric material layer and a surface of the ceramics layer opposite the surface facing the piezoelectric material layer, and
    an adhesive layer which intervenes between the channel unit and the piezoelectric actuator, wherein the elastic layers are a resin layers formed of a resin material, and the thickness of each of the resin layers is about 1 to 10 μm,
wherein elastic layers having a coefficient of elasticity lower than that of the piezoelectric material layer are formed on both surfaces respectively of the stacked body of the piezoelectric actuator.

5. The liquid transporting apparatus according to claim 4, wherein each of the resin layers is formed at a portion, of the piezoelectric layer, corresponding to an area, of the one surface of the channel unit, at which the pressure chamber does not open.

6. The liquid transporting apparatus according to claim 5, wherein the first electrode is arranged on a surface of the piezoelectric material layer, on a side on which the ceramics layer is stacked, and the second electrode is arranged on a portion corresponding to an inner peripheral portion of the pressure chamber.

* * * * *